(12) United States Patent
Kim et al.

(10) Patent No.: US 10,826,531 B2
(45) Date of Patent: Nov. 3, 2020

(54) ERROR CORRECTION CIRCUIT AND OPERATING METHOD THEREOF

(71) Applicant: SK hynix Inc., Icheon-si (KR)

(72) Inventors: Dae Sung Kim, Icheon-si (KR); Soon Young Kang, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/395,640

(22) Filed: Apr. 26, 2019

(65) Prior Publication Data

US 2020/0052716 A1 Feb. 13, 2020

(51) Int. Cl.
*H03M 13/11* (2006.01)

(52) U.S. Cl.
CPC .... *H03M 13/1171* (2013.01); *H03M 13/1128* (2013.01)

(58) Field of Classification Search
None
See application file for complete search history.

(56) References Cited

U.S. PATENT DOCUMENTS

| 7,827,461 B1* | 11/2010 | Low | H03M 13/6591 |
| | | | 714/752 |
| 8,850,295 B2 | 9/2014 | Chen et al. | |
| 9,203,432 B2* | 12/2015 | Varnica | H03M 13/1108 |
| 2014/0068381 A1* | 3/2014 | Zhang | H03M 13/6331 |
| | | | 714/770 |
| 2016/0087653 A1 | 3/2016 | Yang et al. | |
| 2017/0012642 A1* | 1/2017 | Declercq | H03M 13/1108 |

* cited by examiner

*Primary Examiner* — Phung M Chung
(74) *Attorney, Agent, or Firm* — Perkins Coie LLP

(57) ABSTRACT

Provided herein may be an error correction circuit. An error correction circuit for performing error correction decoding based on an iterative decoding scheme using a NB-LDPC code may include a symbol configuration circuit for configuring an initial symbol to be assigned as a variable node value to a variable node, a reliability value initialization circuit for initializing first reliability values of candidate symbols corresponding to the variable node based on the initial symbol assigned to the variable node, and a symbol correction circuit updating the first reliability values of the candidate symbols based on communications received from a check node coupled to the variable node, the candidate symbols having updated first reliability values, respectively, and adjusting the variable node value to one of the candidate symbols based on a comparison with the updated first reliability value of one of the candidate symbols with a first threshold value.

20 Claims, 17 Drawing Sheets

$$H = \begin{bmatrix} \alpha & 0 & 0 & \alpha & \cdots & 0 \\ 0 & \alpha^2 & 0 & 1 & \cdots & \alpha \\ \vdots & \vdots & \vdots & \vdots & & \vdots \\ \alpha & 0 & \alpha^2 & 0 & \cdots & 1 \end{bmatrix} \Big\} n-k$$

$$\underbrace{\phantom{xxxxxxxxxxxxxxxxxxxxxx}}_{n}$$

$$\begin{bmatrix} \alpha & 0 & 0 & \alpha & \cdots & 0 \\ 0 & \alpha^2 & 0 & 1 & \cdots & \alpha \\ \vdots & \vdots & \vdots & \vdots & & \vdots \\ \alpha & 0 & \alpha^2 & 0 & \cdots & 1 \end{bmatrix} \times \begin{bmatrix} C_{i1} \\ C_{i2} \\ C_{i3} \\ \vdots \\ C_{in} \end{bmatrix} = \begin{bmatrix} S_{i1} \\ S_{i2} \\ \vdots \\ S_{in-k} \end{bmatrix}$$

$H$      $C_i^T$      $S_i$

US 10,826,531 B2

ERROR CORRECTION CIRCUIT AND OPERATING METHOD THEREOF

CROSS-REFERENCE TO RELATED APPLICATION

This patent document claims priority to and benefits of the Korean patent application number 10-2018-0094633 filed on Aug. 13, 2018, which is incorporated herein by reference in its entirety.

TECHNICAL FIELD

The technology and implementations disclosed in this patent document generally relate to an error correction circuit and an operating method thereof including an error correction circuit using a Non-Binary Low Density Parity Check (NB-LDPC) code and an operating method thereof.

BACKGROUND

A memory system may include a storage media that stores data therein either temporarily or permanently. During various operations of memory system including writing, reading, transmission, or processing, any data error or any data corruption can occur as a result of interferences between adjacent memory cells. To control the data error and/or the data corruption and ensure the reliability of data, the memory system may use error correction techniques such as error correction encoding and decoding. The error correction techniques may be implemented in the form of hardware and/or software. For example, circuitry for error correction may perform error correction encoding and decoding in the memory system using an error correction code.

Among available error correction code techniques, low-density parity-check (LDPC) codes have been widely used in communication and other systems.

SUMMARY

Various embodiments of the disclosed technology are directed to an error correction circuit for performing error correction decoding using a Non-Binary LDPC (NB-LDPC) code and a method of operating the error correction circuit.

An embodiment of the disclosed technology may provide for a method of operating an error correction circuit, the error correction circuit performing error correction decoding based on an iterative decoding scheme using a Non-Binary Low Density Parity Check (NB-LDPC) code. The method may include assigning an initial symbol as a variable node value to a variable node, initializing, at a start of each iteration, first reliability values of candidate symbols corresponding to the variable node based on the initial symbol assigned to the variable node, updating the first reliability values of the candidate symbols based on communications received from a check node coupled to the variable node, the candidate symbols having updated first reliability values, respectively, and adjusting the variable node value to one of the candidate symbols when the updated first reliability value of the one of the candidate symbols is equal to or greater than a first threshold value.

An embodiment of the disclosed technology may provide for an error correction circuit for performing error correction decoding based on an iterative decoding scheme using a Non-Binary Low Density Parity Check (NB-LDPC) code. The error correction circuit may include a symbol configuration circuit configured to configure an initial symbol to be assigned as a variable node value to a variable node, a reliability value initialization circuit configured to initialize first reliability values of candidate symbols corresponding to the variable node based on the initial symbol assigned to the variable node, and a symbol correction circuit configured to update the first reliability values of the candidate symbols based on communications received from a check node coupled to the variable node, the candidate symbols having updated first reliability values, respectively, and configured to adjust the variable node value to one of the candidate symbols based on a comparison with the updated first reliability value of one of the candidate symbols with a first threshold value.

DETAILED DESCRIPTION

The technology disclosed in this patent document can be implemented in embodiments to provide error correction technique including an error correction decoding using an iterative decoding scheme. Hereinafter, embodiments of the disclosed technology will be described with reference to the attached drawings.

Low-density parity-check (LDPC) codes are widely used for error correction in communication and other systems. The LDPC decoding applies an iterative decoding scheme to improve error correction performance without increasing computational complexity per bit even when the code length increases. Various implementations of LDPC codes have some limitations. For example, hard errors in some LDPC codes can cause inefficiencies in the number of computational cycles or iterations that are needed to produce a successful decoding and may lead to a failed decoding operation.

Figure 1:
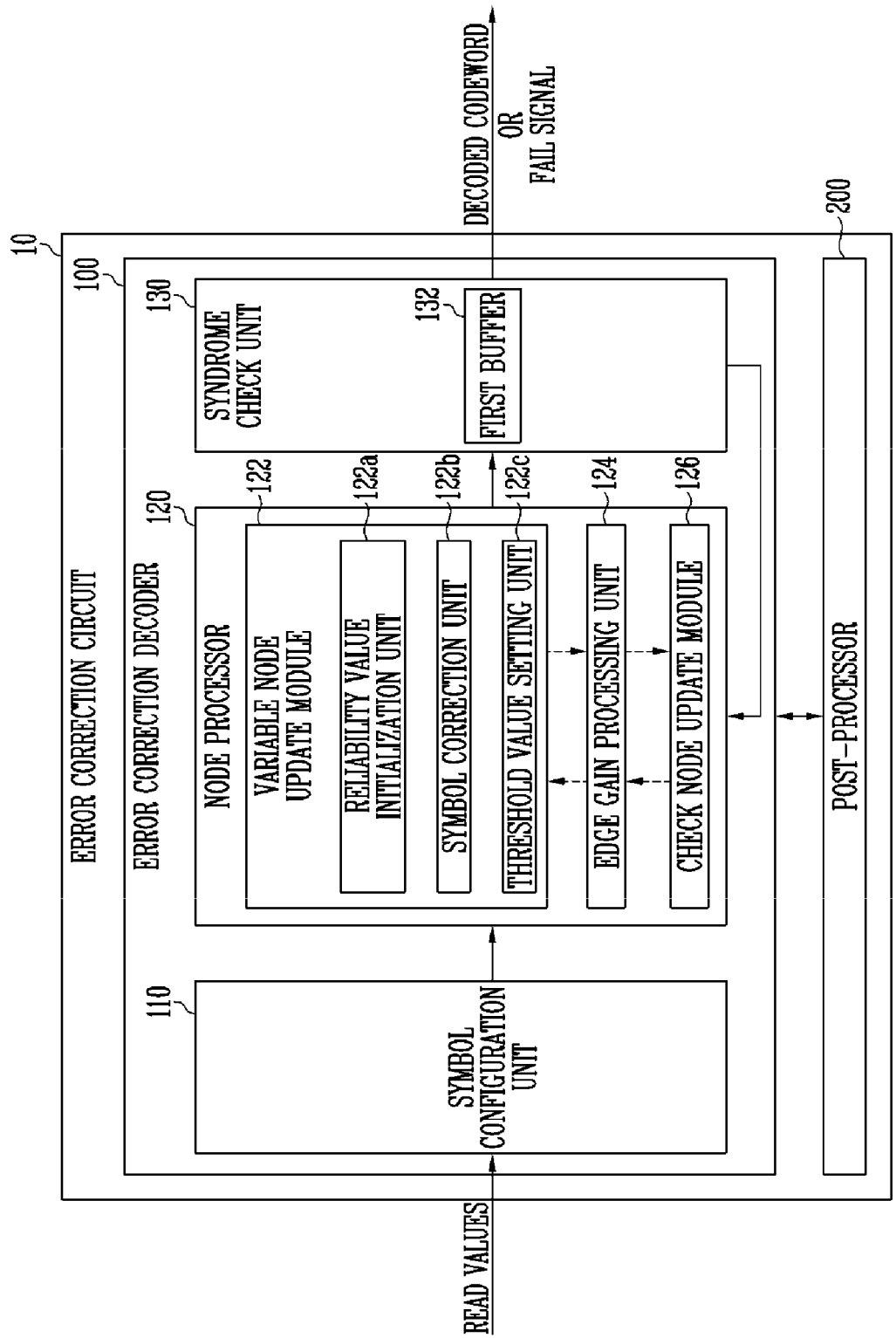
FIG. 1 is a diagram illustrating an error correction circuit based on an embodiment of the disclosed technology.

FIG. 1 is a diagram illustrating an error correction circuit according to an embodiment of the disclosed technology.

Referring to FIG. 1, an error correction circuit 10 according to an embodiment of the disclosed technology may include an error correction decoder 100 and a post-processor 200.

The error correction decoder 100 may perform error correction decoding using various algorithms which adopt an iterative decoding scheme. For example, the error correction decoder 100 may perform error correction decoding using a message passing algorithm (MPA) which is also referred to as a "belief propagation algorithm (BPA)".

The error correction decoder 100 may perform error correction decoding within a predefined maximum iteration number (maximum number of iterations). When a valid codeword that satisfies a parity check matrix of an error correction code is generated within the maximum iteration number, the error correction decoder 100 may output the generated valid codeword as a decoded codeword. When a valid codeword that satisfies the parity check matrix of the error correction code is not generated within the maximum iteration number, the error correction decoder 100 may output a fail signal indicating that error correction decoding has failed.

The error correction decoder 100 may be or include a low density parity check (LDPC) decoder that uses an LDPC code as an error correction code. The error correction decoder 100 may be or include a non-binary LDPC decoder which configures symbols by grouping bits included in read values received from a channel and performs error correction decoding on a symbol basis.

The error correction decoder 100 may include a symbol configuration unit 110, a node processor 120, and a syndrome check unit 130.

The symbol configuration unit 110 may receive read values from the channel. In some implementations, the channel from which the read values are obtained may represent a wired or wireless medium over which information is conveyed or a storage medium in which information is stored. In some implementations of the disclosed technology, the channel may indicate an interface that carries data between the error correction circuit 10 and a memory device, or indicate the memory device itself. The read values may correspond to a codeword, the codeword being generated by adding parity bits to an original message during an error correction encoding. For example, the symbol configuration unit 110 may receive, from a memory device, the read values corresponding to one codeword. Hereinafter, the read values corresponding to a single codeword are referred to as a read vector.

The symbol configuration unit 110 may configure initial symbols by grouping bits included in a read vector, and may provide the configured initial symbols to the node processor 120. For example, when a read vector is composed of 14 bits, the symbol configuration unit 110 may configure seven initial symbols by grouping the bits into units, each unit having two bits.

The node processor 120 may perform error correction decoding based on the initial symbols received from the symbol configuration unit 110. The node processor 120 may perform error correction decoding using various algorithms which adopt the iterative decoding scheme. For example, the node processor 120 may perform error correction decoding using a message passing algorithm (MPA). As the message passing algorithm, a sum-product algorithm, a minimum (min)-sum algorithm, or others may be used. In some implementations, various algorithms, without being limited to the message passing algorithm, may be used as well.

The node processor 120 may perform iterations within the maximum iteration number I, wherein I is a natural number. The node processor 120 produce the values of variable nodes as the result of performing an i-th iteration and provide the values of the variable nodes to the syndrome check unit 130. Here, i is a natural number less than or equal to I. The values of the variable nodes provided to the syndrome check unit 130 may be obtained through the correction based on at least one of a first reliability value and a second reliability value, which will be described later in detail.

The message passing algorithm may generate an output converging to a desired estimate of the read vector through iterations of exchange of messages between variable nodes and check nodes. The messages may include variable to check (V2C) messages that are sent from the variable nodes to the check nodes and check to variable (C2V) messages that are sent from the check nodes to the variable nodes.

A variable node update module 122 may initialize the variable nodes using the initial symbols received from the symbol configuration unit 110 before a first iteration is performed. Thus, the variable node update module 122 may assign the initial symbols as variable node values to respective variable nodes one by one.

The variable node update module 122 may generate V2C messages and send the V2C messages to a check node update module 126 so that, in a first iteration, the variable node values of respective variable nodes (i.e., in case of the first iteration, initial symbol values) may be transferred to check nodes coupled to the corresponding variable nodes. The variable node update module 122 may update the values of the variable nodes in response to C2V messages received from the check node update module 126 in respective iterations. The variable node update module 122 may generate V2C messages based on the C2V messages received from the check node update module 126 in respective iterations except the first iteration, and may send the generated V2C messages to the check node update module 126.

The check node update module 126 may update the values of the check nodes in response to the V2C messages received from the variable node update module 122 in respective iterations. The check node update module 126 may generate C2V messages based on the V2C messages received from the variable node update module 122 in respective iterations, and may send the generated C2V messages to the variable node update module 122.

Edge gain processing or inverse edge gain processing may be performed on messages that are exchanged between the variable node update module 122 and the check node update module 126. For example, an edge gain processing unit 124 may perform edge gain processing on the V2C messages which are generated by the variable node update module 122 and may send the processed V2C messages to the check node update module 126. For example, the edge gain processing unit 124 may perform inverse edge gain processing on the C2V messages which are generated by the check node update module 126 and may send the processed C2V messages to the variable node update module 122. An edge gain may be acquired from a parity check matrix, and may also be referred to as an "edge coefficient" or "edge weight".

The variable node update module 122 may include a reliability value initialization unit 122a, a symbol correction unit 122b, and a threshold value setting unit 122c.

The reliability value initialization unit 122a may initialize first reliability values, which are reliability values of candidate symbols that can be selected as the values of respective variable nodes. The initialization can be performed at the start of each iteration and based on the initial symbols respectively assigned to the plurality of variable nodes. The reliability value initialization unit 122a may initialize the first reliability values of candidate symbols either at the start of an initial iteration or whenever notification that error correction decoding has failed in an i-th iteration is received from the syndrome check unit 130. Here, the candidate symbols may mean all symbols present in a Galois Field GF(q).

The reliability value initialization unit 122a may initialize second reliability values, which are reliability values corresponding to respective variable nodes, at the start of an initial iteration. The second reliability values may represent the unreliability of the current variable node values of the corresponding variable nodes. The reliability value initialization unit 122a may initialize the second reliability values when the values of the corresponding variable nodes are adjusted based on the second reliability values.

The reliability value initialization unit 122a may differently initialize the first reliability values of candidate symbols respectively correspond to the variable nodes. Thus, the first reliability values of candidate symbols are initialized to different values form one another by the reliability value initialization unit 122a. To initialize the first reliability values of candidate symbols to be different from one another, various techniques can be employed by the reliability value initialization unit 122a as discussed below.

In an embodiment, the reliability value initialization unit 122a may differently initialize the first reliability values of respective candidate symbols based on hamming distances between the initial symbol assigned to each of the plurality of variable nodes and the candidate symbols. In an embodiment, the reliability value initialization unit 122a may initialize the first reliability values of candidate symbols to have higher values as the hamming distances between the initial symbol and the candidate symbols are shorter and to have lower values as the hamming distances between the initial symbol and the candidate symbols are longer. For example, it is assumed that GF(4) symbol is used and an initial symbol assigned to an arbitrary variable node is '01'. In this case, there may be four types of candidate symbols corresponding to the arbitrary variable node, for example, '00', '01', '10', and '11'. Hereinafter, each of the symbols '00', '01', '10', and '11' represents a binary representation of GF(4) symbol. The candidate symbol '01' has a hamming distance of 0 to the initial symbol '01', each of the candidate symbols '00' and '11' has a hamming distance of 1 to the initial symbol '01', and the candidate symbol '10' has a hamming distance of 2 to the initial symbol '01'. In some implementations, the first reliability value of the candidate symbol '01' having a hamming distance of 0 to the initial symbol '01' may be initialized to 3, the first reliability values of the candidate symbols '00' and '11', each having a hamming distance of 1 to the initial symbol '01', may be initialized to 1, and the first reliability value of the candidate symbol '10' having a hamming distance of 2 to the initial symbol '01' may be initialized to 0.

In an embodiment, the reliability value initialization unit 122a may differently initialize the first reliability values of respective candidate symbols based on the round of an iteration. In an embodiment, the reliability value initialization unit 122a may initialize the first reliability values to higher values as the iteration round increases. In an embodiment, the reliability value initialization unit 122a may initialize the first reliability value of a candidate symbol to a higher value than that in a previous iteration as the iteration round increases and the hamming distance between the initial symbol and the corresponding candidate symbol is shorter. For example, it is assumed that GF(4) symbol is used and an initial symbol assigned to an arbitrary variable node is '01.' It is also assumed that, in an i-th iteration, the first reliability value of the candidate symbol '01' is initialized to 3, the first reliability values of the candidate symbols '00' and '11' are initialized to 1, and the first reliability value of the candidate symbol '10' is initialized to 0. In some implementations, in an i+1-th iteration, the reliability value initialization unit 122a may initialize the first reliability value of the candidate symbol '01', which has the shortest hamming distance to the initial symbol '01', to 4. In some implementations, the first reliability values of the remaining candidate symbols '00', '11' and '10' may be initialized to the same values as those in a previous iteration round. Alternatively, in an i+1-th iteration, the reliability value initialization unit 122a may initialize the first reliability value of the candidate symbol '01' having the shortest hamming distance to the initial symbol '01' to 5, and may initialize the first reliability values of the candidate symbols '00' and '11' having the next-shortest hamming distance to the initial symbol '01' to 4. In some implementations, the first reliability value of the remaining candidate symbol '10' may be initialized to the same value as that in the previous iteration round. In an embodiment, as the iteration round increases and a hamming distance between the initial symbol and a candidate symbol is shorter, the reliability value initialization unit 122a may initialize the first reliability value of the corresponding candidate symbol to a lower value than that in a previous iteration round.

In an embodiment, the reliability value initialization unit 122a may initialize the first reliability values of respective candidate symbols based on the number of Unsatisfied Check Nodes (UCNs). In an embodiment, the reliability value initialization unit 122a may initialize the first reliability values to higher values in an i+1-th iteration as the number of UCNs is greater in an i-th iteration. In an embodiment, the reliability value initialization unit 122a may initialize the first reliability value of a candidate symbol to a higher value in an i+1-th iteration as the number of UCNs is greater in an i-th iteration and a hamming distance between the initial symbol and the candidate symbol is shorter. For example, it is assumed that GF(4) symbol is used and an initial symbol assigned to an arbitrary variable node is '01.' It is also assumed that, in an i-th iteration, the first reliability value of the candidate symbol '01' is initialized to 3, the first reliability values of the candidate symbols '00' and '11' are initialized to 1, and the first reliability value of the candidate symbol '10' is initialized to 0. In this case, when the number of UCNs in the i-th iteration is 3, the reliability value initialization unit 122a may initialize the first reliability values of all candidate symbols in the i+1-th iteration to the same values as those in the i-th iteration. When the number of UCNs in the i-th iteration is 5, the reliability value initialization unit 122a may initialize the first reliability value of the candidate symbol '01' having a shortest hamming distance to the initial symbol '01' to 4 in the i+1-th iteration. In some implementations, the first reliability values of the remaining candidate symbols '00', '11' and '10' may be initialized to the same values as those in the previous iteration round. In accordance with an embodiment, the reliability value initialization unit 122a may initialize the first reliability value of a candidate symbol to a lower value in an i+1-th iteration as the number of UCNs is greater in an i-th iteration and a hamming distance between the initial symbol and the candidate symbol is shorter.

The symbol correction unit 122b may update the first reliability values of candidate symbols corresponding to the respective variable nodes based on C2V messages received in accordance with the respective variable nodes in each iteration. In an embodiment, the symbol correction unit 122b may increase the first reliability value of an arbitrary candidate symbol by the number of receptions of C2V messages indicating the arbitrary candidate symbol. For example, when one C2V message indicating the candidate symbol '10' is received, the symbol correction unit 122b may increase the first reliability value of the candidate symbol '10' by 1. Also, when two C2V messages indicating the candidate symbol '10' are received, the symbol correction unit 122b may increase the first reliability value of the candidate symbol '10' by 2.

After updating the first reliability values of the candidate symbols, the symbol correction unit 122b may adjust the value of at least one variable node based on the updated first reliability value. The symbol correction unit 122b may determine, for each of the variable nodes, whether a candidate symbol has a first reliability value equal to or greater than a first threshold value. The symbol correction unit 122b may adjust the value of the variable node when the corresponding candidate symbol has the first reliability value equal to or greater than the first threshold value. For example, when any one of the candidate symbols has a first reliability value equal to or greater than the first threshold value, the symbol correction unit 122b may adjust the value of the variable node corresponding to the candidate symbol to the candidate symbol having the first reliability value equal to or greater than the first threshold value.

Thus, the value of the variable node is adjusted based on the first reliability value when there exists any candidate symbol having the first reliability value equal to or greater than the first threshold value. Meanwhile, in order to guarantee the reliability of variable nodes even when there is no candidate symbol having a first reliability value equal to or greater than the first threshold value, a second reliability value other than the first reliability value is introduced. The second reliability value may indicate reliability or unreliability of the current value of the variable node. In order to indicate the second reliability value, either one bit or two or more bits may be assigned. Two cases that the second reliability value has one bit or multiple bits will be separately described below.

First, a case where one bit is assigned to indicate a second reliability value will be described below.

For each of variable nodes whose corresponding candidate symbol has a first reliability value which is less than a first threshold value, the symbol correction unit 122b may determine whether a candidate symbol having a first reliability value that is equal to or greater than the second threshold value less than the first threshold value is present among the candidate symbols. When there is a variable node in which a corresponding candidate symbol having a first reliability value that is less than the first threshold value and is equal to or greater than the second threshold value is present, the symbol correction unit 122b may determine whether a second reliability value is set in the corresponding variable node. For example, the symbol correction unit 122b may check whether a bit assigned to indicate the second reliability value is set to 1.

When a second reliability value is not set in the variable node corresponding to the candidate symbol having the first reliability value that is less than the first threshold value and is equal to or greater than the second threshold value, the symbol correction unit 122b may set the second reliability value in the corresponding variable node. Thus, when a candidate symbol having the first reliability value equal to or greater than the first threshold value is not present among the candidate symbols in the variable node, but a candidate symbol having the first reliability value equal to or greater than the second threshold value that is less than the first threshold value is present among the candidate symbols, the symbol correction unit 122b may set the second reliability value in the corresponding variable node. For example, the symbol correction unit 122b may set the second reliability value to 1 for the corresponding variable node. A second reliability value corresponding to an arbitrary variable node may not be initialized until the value of the arbitrary variable node is adjusted based on the second reliability value.

The symbol correction unit 122b may adjust the value of the corresponding variable node when a second reliability value is set in the variable node. As described above, the second reliability value is set in the variable node when a corresponding candidate symbol having the first reliability value that is less than the first threshold value and is equal to or greater than the second threshold value is present. For example, when the second reliability value is set, the symbol correction unit 122b may adjust the value of the variable node to the candidate symbol having the first reliability value that is less than the first threshold value and is equal to or greater than the second threshold value. When the value of the variable node is adjusted, the symbol correction unit 122b may notify the reliability value initialization unit 122a of such adjustment. Accordingly, the reliability value initialization unit 122a may initialize the second reliability value of the corresponding variable node.

Next, a case where two or more bits are assigned to indicate a second reliability value will be described below.

When two or more bits are assigned to indicate a second reliability value, n (where n is a natural number of 4 or more) threshold values may be used. For each of variable nodes in which its corresponding candidate symbol having a first reliability value equal to or greater than the first threshold value is not present, the symbol correction unit 122b may determine whether a candidate symbol having a first reliability value that is equal to or greater than second to n−1-th threshold values less than the first threshold value is present among the candidate symbols. Such a determination may be performed sequentially from higher threshold values, that is, in the sequence of the second threshold value to the n−1-th threshold value. Here, when it is determined that a candidate symbol, which has a first reliability value equal to or greater than any one of the second to n−1-th threshold values, is present among the candidate symbols, determination as to the remaining threshold values may not be performed. For example, the determination of whether a candidate symbol, which has a first reliability value equal to or greater than the third to n−1-th threshold values, is present among the candidate symbols may not be performed as to a variable node in which a candidate symbol having a first reliability value equal to or greater than the second threshold value is present.

When it is determined that a candidate symbol, which has a first reliability value equal to or greater than any one of the second to n−1-th threshold values, is present, the symbol correction unit 122b may increase the second reliability value of the corresponding variable node by a set value corresponding to the relevant threshold value. Here, the greater the relevant threshold value, the higher the set value. For example, when there is a candidate symbol having a first reliability value equal to or greater than the second threshold value, the symbol correction unit 122b may increase the second reliability value of the corresponding variable node by a first set value, whereas when there is a candidate symbol having a first reliability value equal to or greater than the third threshold value, the symbol correction unit 122b may increase the second reliability value of the corresponding variable node by a second set value less than the first set value.

The symbol correction unit 122b may determine whether the updated second reliability value is equal to or greater than an n-th threshold value. When the updated second reliability value is less than the n-th threshold value, the second reliability value may be accumulatively calculated in next iterations. When the updated second reliability value is equal to or greater than the n-th threshold value, the symbol correction unit 122b may adjust the value of the corresponding variable node. For example, the symbol correction unit 122b may adjust the value of the corresponding variable node to a candidate symbol to which the second reliability value is updated in a current iteration.

When the value of the variable node is adjusted based on the second reliability value, the symbol correction unit 122b may notify the reliability value initialization unit 122a of such an adjustment. Accordingly, the reliability value initialization unit 122a may initialize the second reliability value of the corresponding variable node.

The symbol correction unit 122b may provide the values of variable nodes to the syndrome check unit 130 in each iteration. At least one of the values of the variable nodes, provided to the syndrome check unit 130, may be a value adjusted based on a first reliability value and a second reliability value.

The threshold value setting unit 122c may set threshold values that are criteria for determining whether to adjust the values of variable nodes.

In an embodiment, the threshold value setting unit 122c may set initial threshold values to predefined values. The initial threshold values exist before a first iteration is performed. In an embodiment, the threshold value setting unit 122c may set a same n-th threshold value for all variable nodes. For example, the same first threshold value may be set for all variable nodes, and the same second threshold value may also be set for all variable nodes.

In an embodiment, the threshold value setting unit 122c may set the initial threshold values to different values depending on the degrees of variable nodes. For example, the threshold value setting unit 122c may set the initial threshold values to higher values for variable nodes having higher degrees and set the initial threshold values to lower values for variable nodes having lower degrees.

In an embodiment, the threshold value setting unit 122c may change at least one of the threshold values depending on the round of an iteration. For example, the threshold value setting unit 122c may set at least one of the threshold values to a higher value as the iteration round increases. In some implementations, the threshold value setting unit 122c may set at least one of the threshold values to a lower value as the iteration round increases.

In an embodiment, the threshold value setting unit 122c may change at least one of the threshold values depending on the number of UCNs corresponding to a syndrome check. For example, the threshold value setting unit 122c may set at least one of the threshold values to a higher value in an i+1-th iteration as the number of UCNs corresponding to an i-th iteration is greater. In some implementations, the threshold value setting unit 122c may set at least one of the threshold values to a lower value as the number of UCNs corresponding to an i-th iteration is greater.

The syndrome check unit 130 may receive the values of the variable nodes (e.g., variable node vector) from the node processor 120 as the result of the i-th iteration. The syndrome check unit 130 may store the values of the variable nodes in a first buffer 132, and may perform a syndrome check on the received variable node vector. For example, the syndrome check may be performed by checking whether all entries of a syndrome vector $S_i$ calculated by the following Equation (1) are '0'.

$$S_i = H \cdot C_i^T \quad (1)$$

Here, $S_i$ denotes a syndrome vector in an i-th iteration, H denotes a parity check matrix of an error correction code, and $C_i^T$ denotes the transpose of a variable node vector $C_i$ in the i-th iteration.

A case where all entries of the syndrome vector $S_i$ are '0' means that the syndrome check has passed. This means that error correction decoding has been successfully performed in the i-th iteration, and thus the syndrome check unit 130 may output the variable node vector, which is stored in the first buffer 132, as a decoded codeword.

Meanwhile, a case where entries other than '0' are present among the entries of the syndrome vector $S_i$ means that the syndrome check has failed. This means that error correction decoding has failed in the i-th iteration. When error correction decoding has failed in the i-th iteration, the syndrome check unit 130 may transmit the syndrome vector $S_i$ corresponding to the i-th iteration to the node processor 120 or may provide information about the number of Unsatisfied Check Nodes (UCNs) corresponding to the syndrome vector $S_i$ to the node processor 120. Here, UCN may correspond to each entry other than '0' among the entries of the syndrome vector $S_i$.

If a valid codeword that satisfies the parity check matrix of the error correction code is not generated within the maximum iteration number I, the syndrome check unit 130 may output a fail signal indicating that the error correction decoding has failed. The processes and operations performed by the syndrome check unit 130, which include determining the pass or the fail and outputting the corresponding codeword or the fail signal, will be further explained with reference to FIGS. 2 to 4 later in this document.

The post-processor 200 may support the error correction decoder 100 so that the error correction decoder 100 is capable of generating a valid codeword. For example, when the error correction decoder 100 fails to generate a valid codeword within the maximum iteration number, the post-processor 200 may assist the error correction decoder 100. With the assist of the post-processor 200, various parameters used for error correction decoding are modified and the error correction decoder 100 performs the error correction decoding again using the modified parameters.

Figures 2, 3:
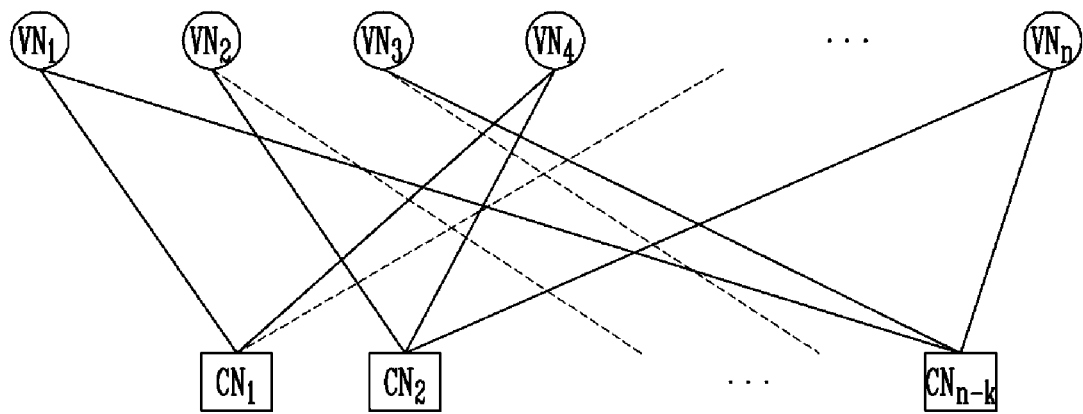
FIG. 2 is a diagram illustrating an example of a parity check matrix.
FIG. 3 is a diagram illustrating an example of a Tanner graph for the parity check matrix of FIG. 2.

FIG. 2 is a diagram illustrating an example of a parity check matrix.

In FIG. 2, an example of a parity check matrix H defining a (n, k) code is depicted. The (n, k) code may be defined as a parity check matrix having a (n–k)×n size. Respective entries in the parity check matrix may be represented by elements belonging to a Galois field. The Galois field GF(q) is a finite field of q elements, and the elements of the Galois field GF(q) may be represented by $\{0, \alpha^0, \alpha^1, \ldots, \alpha^{q-2}\}$. When the number of non-zero entries $\alpha^0, \alpha^1, \ldots, \alpha^{q-2}$ included in the parity check matrix is much smaller than the number of 0s, the (n, k) code may be referred to as a (n, k) LDPC code. Here, n and k may be natural numbers. Meanwhile, a LDPC code belonging to the Galois field denoted by GF(2) may be a binary LDPC code, and an LDPC code belonging to the Galois field denoted by GF(q) (where q>2) may be a Non-Binary LDPC (NB-LDPC) code. In FIG. 2, the parity check matrix of an NB-LDPC code having elements of GF(4) as entries is illustrated by way of example.

FIG. 3 is a diagram illustrating an example of a Tanner graph for the parity check matrix of FIG. 2.

A (n, k) code may be represented by a Tanner graph which is an expression of a bipartite graph. The Tanner graph may be represented by check nodes, variable nodes, and edges. The check nodes may correspond to rows of the parity check matrix, and the variable nodes may correspond to columns of the parity check matrix. Each edge couples to a single check node to a single variable node, and denotes an entry represented by an element other than 0 in the parity check matrix.

As illustrated in FIG. 3, the parity check matrix of the (n, k) code illustrated in FIG. 2 may be represented by a Tanner graph including n-k check nodes $CN_1$ to $CN_{n-k}$ and n variable nodes $VN_1$ to $VN_n$. Solid lines and dotted lines, which couple the check nodes $CN_1$ to $CN_{n-k}$ to the variable nodes $VN_1$ to $VN_n$, indicate edges.

Iterative decoding may be performed based on an iterative message passing algorithm between the check nodes $CN_1$ to $CN_{n-k}$ and the variable nodes $VN_1$ to $VN_n$ in the Tanner graph illustrated in FIG. 3. In each iteration, iterative decoding may be performed while C2V messages and V2C messages are transferred between the check nodes $CN_1$ to $CN_{n-k}$ and the variable nodes $VN_1$ to $VN_n$. The variable nodes may perform error correction using C2V messages received from the check nodes coupled thereto, and the check nodes may perform a check operation using V2C messages received from the variable nodes coupled thereto. When a result value obtained by any one check node performing an Exclusive OR (XOR) operation on the values of all variable nodes coupled thereto is composed of only 0, the corresponding check node may be determined to be satisfied. In contrast, when a result value obtained by any one check node performing an XOR operation on the values of all variable nodes coupled thereto contains an element other than 0, the corresponding check node may be determined to be unsatisfied, and may be referred to as a "UCN". Here, the values of the variable nodes on which the XOR operation is performed may be values obtained after the edge gain processing.

Figures 4, 5:
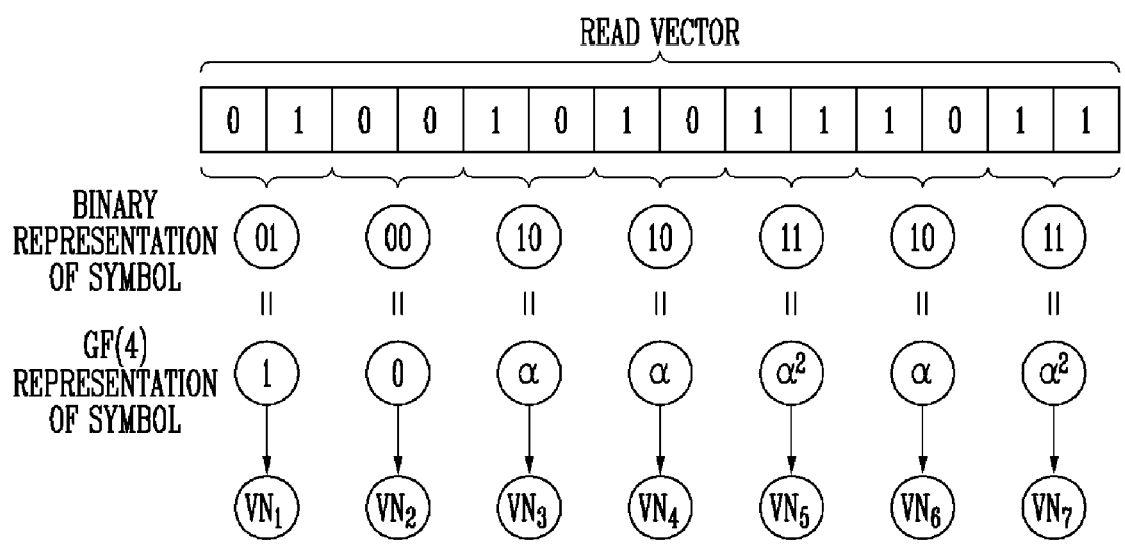
FIG. 4 is a diagram illustrating an example of a syndrome vector calculated using the parity check matrix of FIG. 2.
FIG. 5 is a diagram illustrating an example of a symbol configuration process based on an embodiment of the disclosed technology.

FIG. 4 is a diagram illustrating an example of a syndrome vector calculated using the parity check matrix shown in FIG. 2.

As described above, a syndrome vector $S_i$ may be calculated based on a parity check matrix H and the transpose $C_i^T$ of a variable node vector $C_i$ that is a result value from an i-th iteration. Respective entries $S_{i1}, S_{i2}, \ldots, S_{in-k}$ of the syndrome vector $S_i$ correspond to the check nodes $CN_1$ to $CN_{n-k}$ in the Tanner graph illustrated in FIG. 3.

If all entries $S_{i1}, S_{i2}, \ldots, S_{in-k}$ of the syndrome vector $S_i$ indicate '0,' it is determined that a syndrome check has passed. Therefore, iterative decoding on the corresponding read vector may be terminated, and the variable node vector $C_i$ that is the result value from the i-th iteration may be output as a decoded codeword.

If among entries $S_{i1}, S_{i2}, \ldots, S_{in-k}$ of the syndrome vector $S_i$, there exists at least one entry which is not 0, it is determined that a syndrome check has failed. Therefore, when the number of iterations does not yet reach the maximum iteration number, a next iteration may be performed. Here, an entry which is not 0 is referred to as a UCN.

FIG. 5 is a diagram illustrating an example of a symbol configuration process based on an embodiment of the disclosed technology.

In the embodiment shown in FIG. 5, it is assumed that a read vector received from a channel is composed of 14 bits.

A symbol configuration unit 110 may group bits included in the read vector into a predetermined number of units to configure a plurality of symbols. For example, when GF(4) symbol is used, the symbol configuration unit 110 may configure a single symbol to include two bits. Since when the read vector is composed of 14 bits the symbol configuration unit 110 may configure a total of seven symbols, each symbol including two bits. The symbol configuration unit may sequentially assign the configured symbols to variable nodes $VN_1, \ldots, VN_7$.

Below, it is assumed that a binary representation of '00' corresponds to a GF(4) representation of '0', a binary representation of '01' corresponds to a GF(4) representation of '1', a binary representation of '10' corresponds to a GF(4) representation of '$\alpha$', and a binary representation of '11' corresponds to a GF(4) representation of '$\alpha^2$'.

Figure 6:
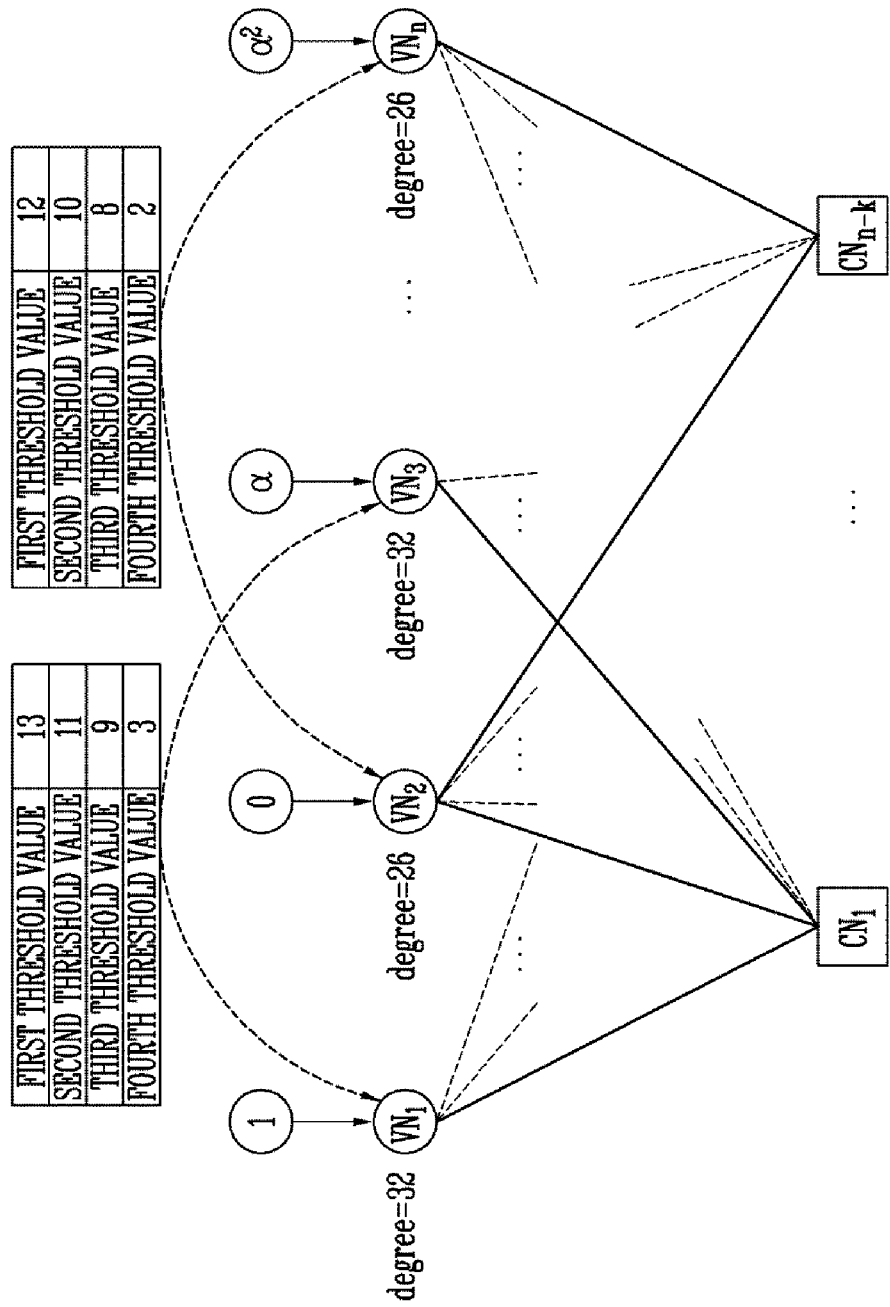
FIG. 6 is a diagram for explaining threshold values based on an embodiment of the disclosed technology.

FIG. 6 is a diagram for explaining threshold values based on an embodiment of the disclosed technology. In setting threshold values which are used to adjust the value of each variable node, the following different cases can be considered based on whether a second reliability value is used for adjusting the value of each variable node and based on whether a single or multiple bits are assigned to indicate the second reliability value.

When only a first reliability value is used and a second reliability value is not used, a single threshold value, i.e., a first threshold value, may be used as a determination criterion for adjusting the value of each variable node.

When both of a first reliability value and a second reliability value are used and a single bit is assigned to indicate the second reliability value, two threshold values, that is, a first threshold value and a second threshold value, may be used as determination criteria for adjusting the value of each variable node.

When both of a first reliability value and a second reliability value are used, and two or more bits are assigned to indicate the second reliability value, n threshold values (where n is a natural number of 4 or more) may be used as determination criteria for adjusting the value of each variable node.

FIG. 6 illustrates, as an example, a case where both of a first reliability value and a second reliability value are used, two or more bits are assigned to indicate the second reliability value, and four threshold values are used as determination criteria for adjusting the values of variable nodes.

For example, first to third threshold values may be reference values to be compared with the first reliability values of candidate symbols and the fourth threshold value may be a reference value to be compared with the second reliability values of the variable nodes.

As described above, the threshold values may be differently set depending on the degrees of the variable nodes. For example, at least one of the threshold values may be set to a higher value in a variable node with a higher degree, and at least one of the threshold values may be set to a lower value in a variable node with a lower degree. In some implementations, it is also possible to set the threshold values in the opposite manner such that at least one of the threshold values may be set to a lower value in a variable node with a higher degree, and at least one of the threshold voltages may be set to a higher value in a variable node with a lower degree.

In an example shown in FIG. 6, higher threshold values are set in variable nodes $VN_1$ and $VN_3$ having a relatively higher degree of 32, and lower threshold values are set in variable nodes $VN_2$ and $VN_n$ having a relatively lower degree of 26.

Figure 7:
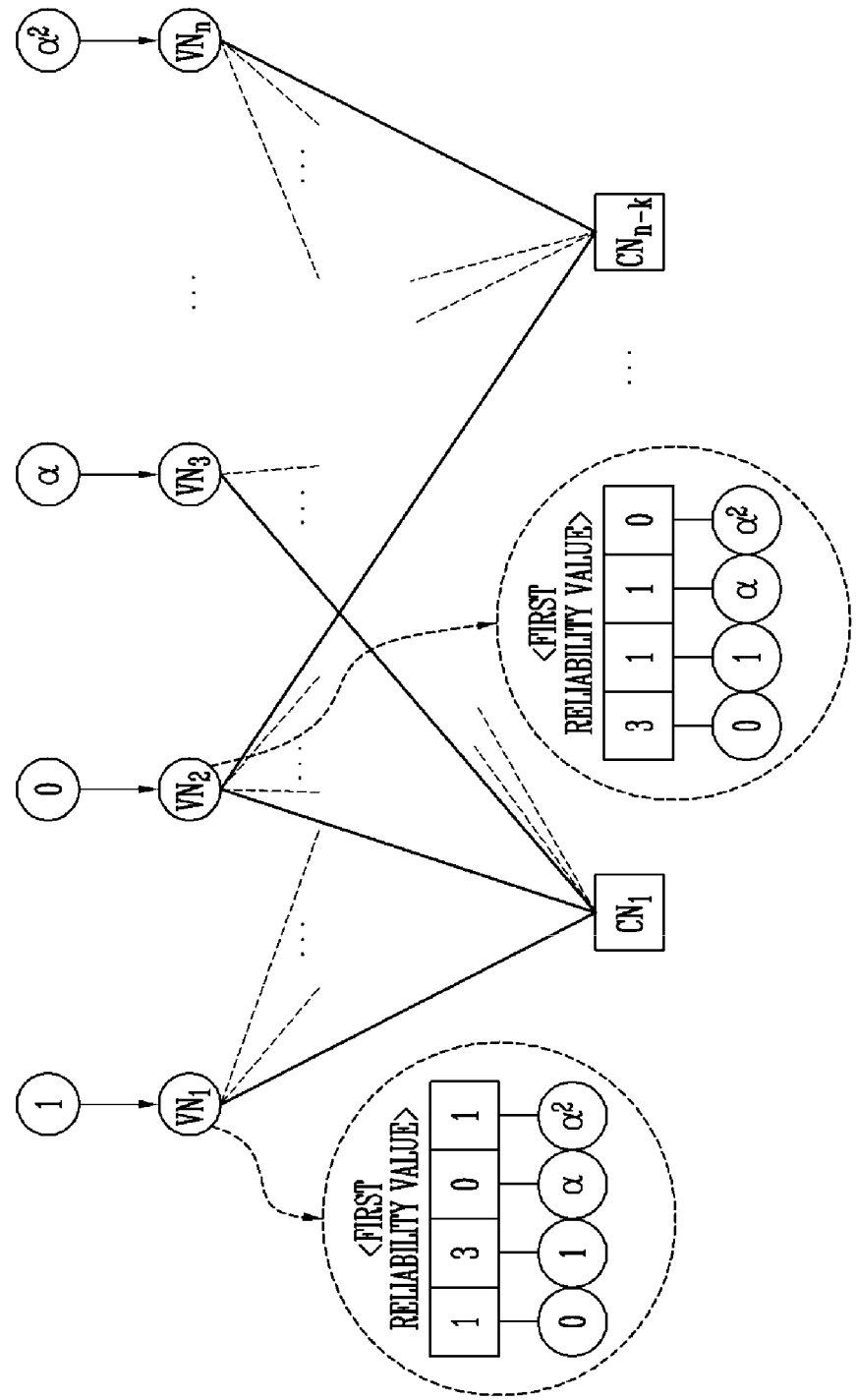
FIG. 7 is a diagram illustrating an example of a process for initializing first reliability values based on an embodiment of the disclosed technology.

FIG. 7 is a diagram illustrating an example of a process for initializing first reliability values according to an embodiment of the disclosed technology.

In FIG. 7, for convenience of description, only some of the variable nodes and only some of the check nodes, which are included in a Tanner graph, are illustrated. As illustrated in FIG. 7, it is assumed that GF(4) symbol is used, and that the initial symbol '1' is assigned to a variable node $VN_1$, the initial symbol '0' is assigned to a variable node $VN_2$, the initial symbol '$\alpha$' is assigned to a variable node $VN_3$, and the initial symbol '$\alpha^2$' is assigned to a variable node $VN_n$.

In the example of FIG. 7, the first reliability values of candidate symbols are initialized to higher values as hamming distances between initial symbols assigned to respective variable nodes and the candidate symbols corresponding to the variable nodes are shorter. For convenience of description, in the following descriptions, only two variable nodes $VN_1$ and $VN_2$ among the variable nodes $VN_1, \ldots, VN_n$ are discussed in detail as examples and the same configuration may also be applied to the remaining variable nodes $VN_3, \ldots, VN_n$.

FIG. 7 shows first reliability values set for candidate symbols '0,' '1,' '$\alpha$,' and '$\alpha^2$' for each of the variable nodes. Referring to FIG. 7, a first reliability value of 3 that is the highest value may be set for the closest candidate symbol '1' that has the shortest hamming distance of 0 to the initial symbol '1' of the variable node $VN_1$, among the candidate symbols of the variable node $VN_1$. A first reliability value of 0 that is the lowest value may be set for the farthest candidate symbol 'a' that has the longest hamming distance of 2 to the initial symbol '1' of the variable node $VN_1$, among the candidate symbols of the variable node $VN_1$. A first reliability value of 1 that is an intermediate value between the highest value of '3' and the lowest value of '0' may be set for the candidate symbols '0' and '$\alpha^2$' that have a hamming distance of 1 to the initial symbol '1' of the variable node $VN_1$, among the candidate symbols of the variable node $VN_1$.

Similarly, a first reliability value of 3 that is the highest value may be set for the closest candidate symbol '0' that has the shortest hamming distance of 0 to the initial symbol '0' of the variable node $VN_2$, among the candidate symbols of the variable node $VN_2$. A first reliability value of 0 that is the lowest value may be set for the farthest candidate symbol '$\alpha^2$' that has the longest hamming distance of 2 to the initial symbol '0' of the variable node $VN_2$, among the candidate symbols of the variable node $VN_2$. A first reliability value of 1 that is an intermediate value between the highest value of '3' and the lowest value of '0' may be set for the candidate symbols '1' and '$\alpha$' that have a hamming distance of 1 to the initial symbol '0' of the variable node $VN_2$, among the candidate symbols of the variable node $VN_2$.

Figure 8:
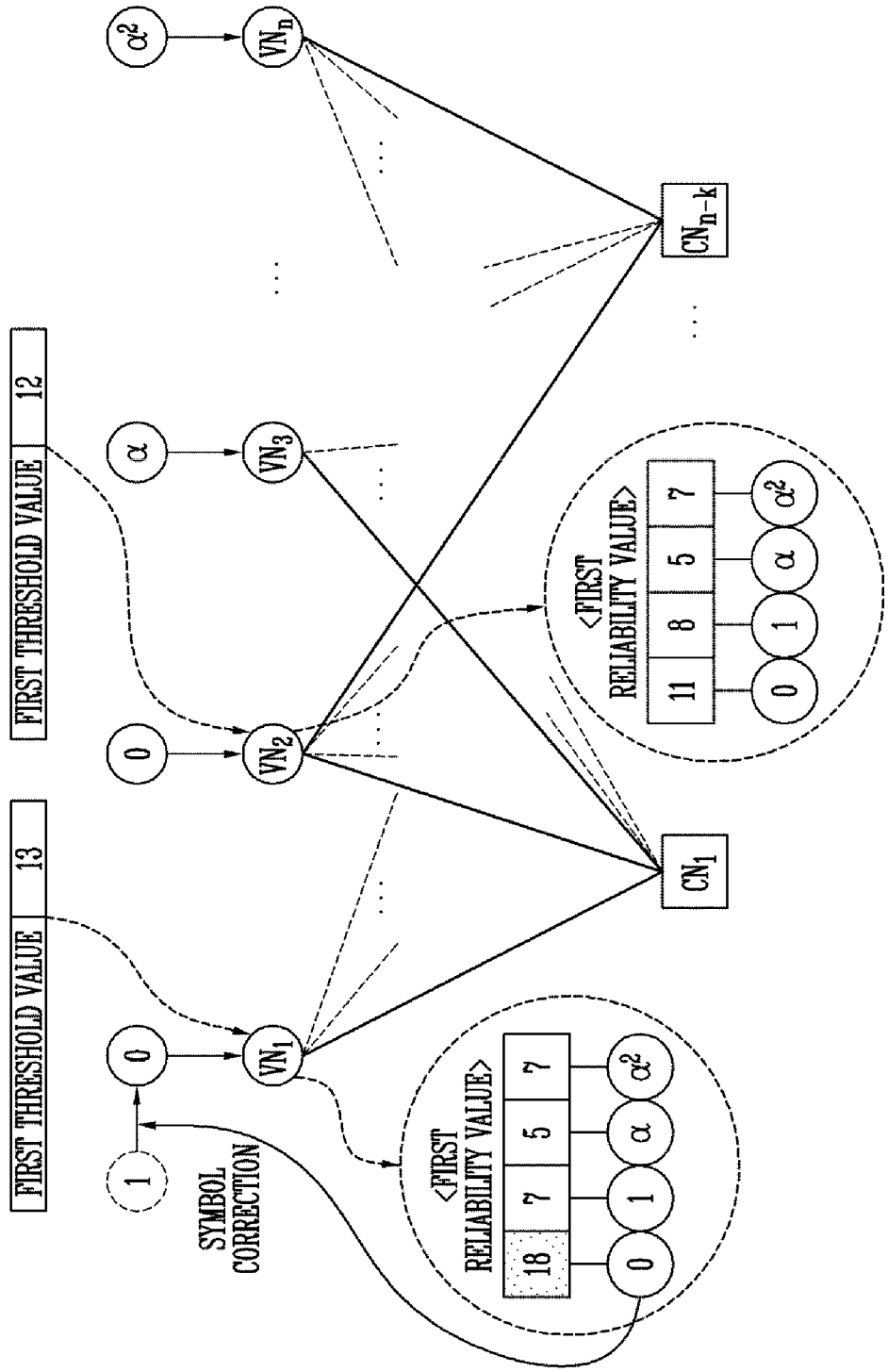
FIG. 8 is a diagram illustrating an example of a process for correcting a symbol depending on first reliability values based on an embodiment of the disclosed technology.

FIG. 8 is a diagram illustrating an example of a process for correcting a symbol depending on first reliability values based on an embodiment of the disclosed technology.

A symbol correction unit 122b may update first reliability values of candidate symbols corresponding to respective variable nodes $VN_1, VN_2, VN_3, \ldots, VN_n$ depending on C2V messages that are input to the respective variable nodes $VN_1, VN_2, VN_3, \ldots, VN_n$ in each iteration. For example, the symbol correction unit 122b may increase the first reliability value of an arbitrary candidate symbol by the number of C2V messages received at the variable node update module 122 and indicating the arbitrary candidate symbol. For example, when one C2V message indicating the candidate symbol '$\alpha$' is received, the symbol correction unit 122b may increase the first reliability value of the candidate symbol '$\alpha$' by 1. Further, when two C2V messages indicating the candidate symbol '$\alpha$' are received, the symbol correction unit 122b may increase the first reliability value of the candidate symbol '$\alpha$' by 2.

In the example of FIG. 8, the first reliability values of candidate symbols of the variable nodes $VN_1$ and $VN_2$ are updated from their initial values shown in FIG. 7. It is assumed that, after the initialization process described with reference to FIG. 7, the variable node $VN_1$ receives seventeen C2V messages indicating the candidate symbol '0', receives four C2V messages indicating the candidate symbol '1', receives five C2V messages indicating the candidate symbol '$\alpha$', and receives six C2V messages indicating the candidate symbol '$\alpha^2$'. Therefore, the first reliability value of the candidate symbol '0' of the variable node $VN_1$ may be updated to 18 from the initial value of 1, the first reliability value of the candidate symbol '1' of the variable node $VN_1$ may be updated to 7 from the initial value of 3, the first reliability value of the candidate symbol '$\alpha$' of the variable node $VN_1$ may be updated to 5 from the initial value of 0, and the first reliability value of the candidate symbol '$\alpha^2$' in the variable node $VN_1$ may be updated to 7 from the initial value of 1.

In the example of FIG. 8, it is assumed that the variable node $VN_2$ receives eight C2V messages indicating the candidate symbol '0', receives seven C2V messages indicating the candidate symbol '1', receives four C2V messages indicating the candidate symbol '$\alpha$', and receives seven C2V messages indicating the candidate symbol '$\alpha^2$'. Therefore, the first reliability value of the candidate symbol '0' of the variable node $VN_2$ may be updated to 11 from the initial value of 3, the first reliability value of the candidate symbol '1' of the variable node $VN_2$ may be updated to 8 from the initial value of 1, the first reliability value of the candidate symbol '$\alpha$' of the variable node $VN_2$ may be updated to 5 from the initial value of 1, and the first reliability value of the candidate symbol '$\alpha^2$' of the variable node $VN_2$ may be updated to 7 from the initial value of 0.

After the first reliability values have been updated, the symbol correction unit 122b may check, for each of the variable nodes, whether a candidate symbol having a first reliability value equal to or greater than a first threshold value is present among the candidate symbols, and may adjust the value of the variable node which has a corresponding candidate symbol having the first reliability value equal to or greater than the first threshold value. In the example of FIG. 8, it is assumed that the first threshold value corresponding to the variable node $VN_1$ is set to 13 and that the first threshold value corresponding to the variable node $VN_2$ is set to 12.

In the case of the variable node $VN_1$, since the first reliability value of the candidate symbol '0', among the candidate symbols of the variable node $VN_1$, is equal to or greater than 13 which is the first threshold value corresponding to the variable node $VN_1$, the value of the variable node $VN_1$ may be adjusted from '1' to '0'. In the case of the variable node $VN_2$, since there is no candidate symbol having a first reliability value equal to or greater than 12, which is the first threshold value corresponding to the variable node $VN_2$, among the candidate symbols of the variable node $VN_2$, the value of the variable node $VN_2$ may not be adjusted.

Figure 9:
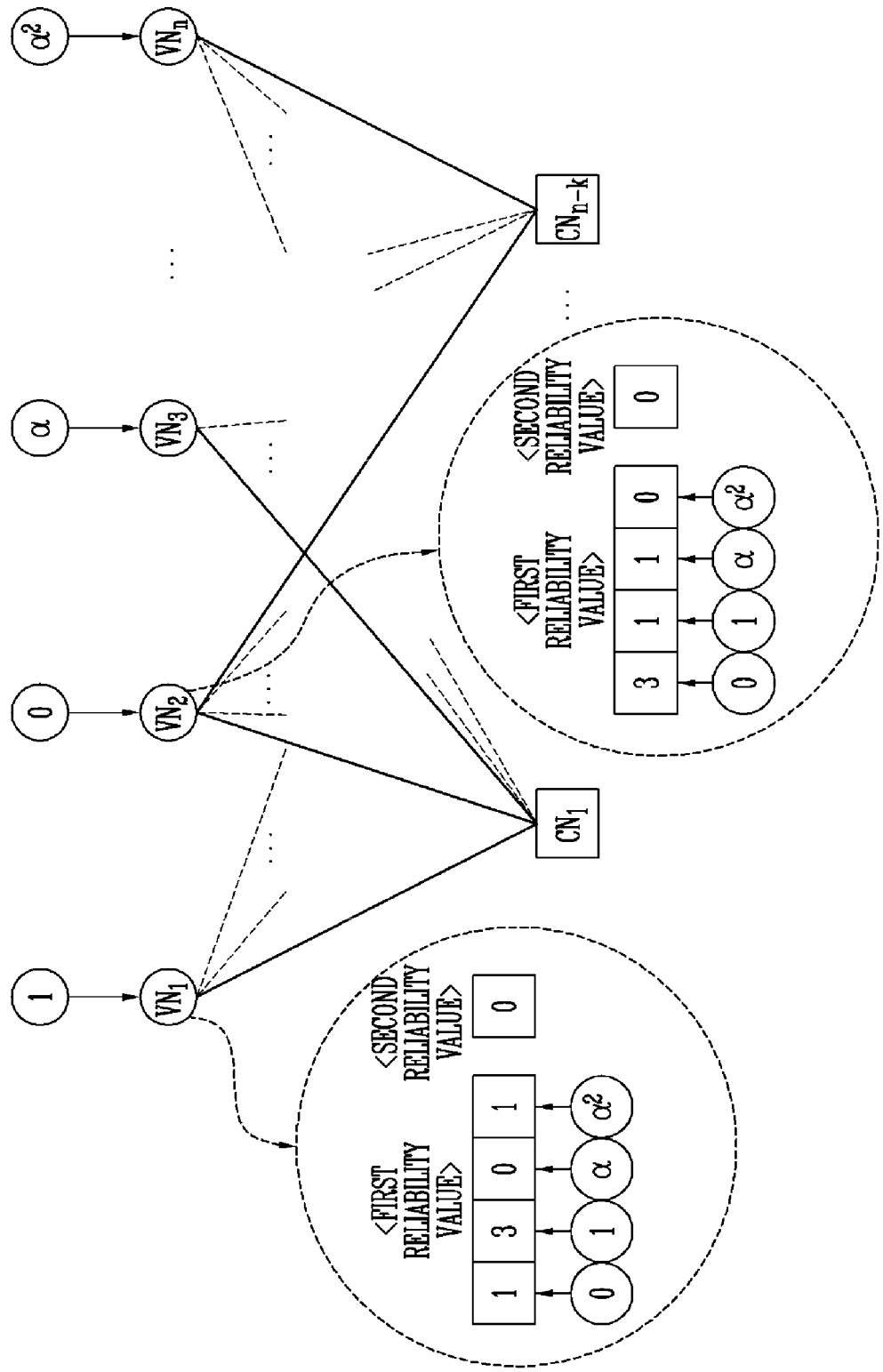
FIG. 9 is a diagram for explaining second reliability values based on an embodiment of the disclosed technology.

FIG. 9 is a diagram for explaining second reliability values based on an embodiment of the disclosed technology.

Unlike the embodiment of FIG. 7, in FIG. 9, second reliability values as well as first reliability values are set for respective variable nodes. As described above, when a candidate symbol having a first reliability value equal to or greater than a first threshold value is not present among the candidate symbols of a variable node, but a candidate symbol having a first reliability value equal to or greater than a predetermined threshold value is present, a second reliability value may be set (or updated) in the corresponding variable node. When the variable node has the second reliability value, it can be considered that there is a possibility that the current value of the variable node has an error. In other words, the second reliability value may indicate the unreliability of the current value of the variable node.

The first reliability value may be initialized whenever each iteration starts, but the second reliability value may not be initialized even if the iteration process proceeds. However, the second reliability value may be initialized when the value of the variable node is adjusted to any one of candidate symbols based on the second reliability value. As described above, either one bit or two or more bits may be assigned to indicate the second reliability value.

Figure 10:
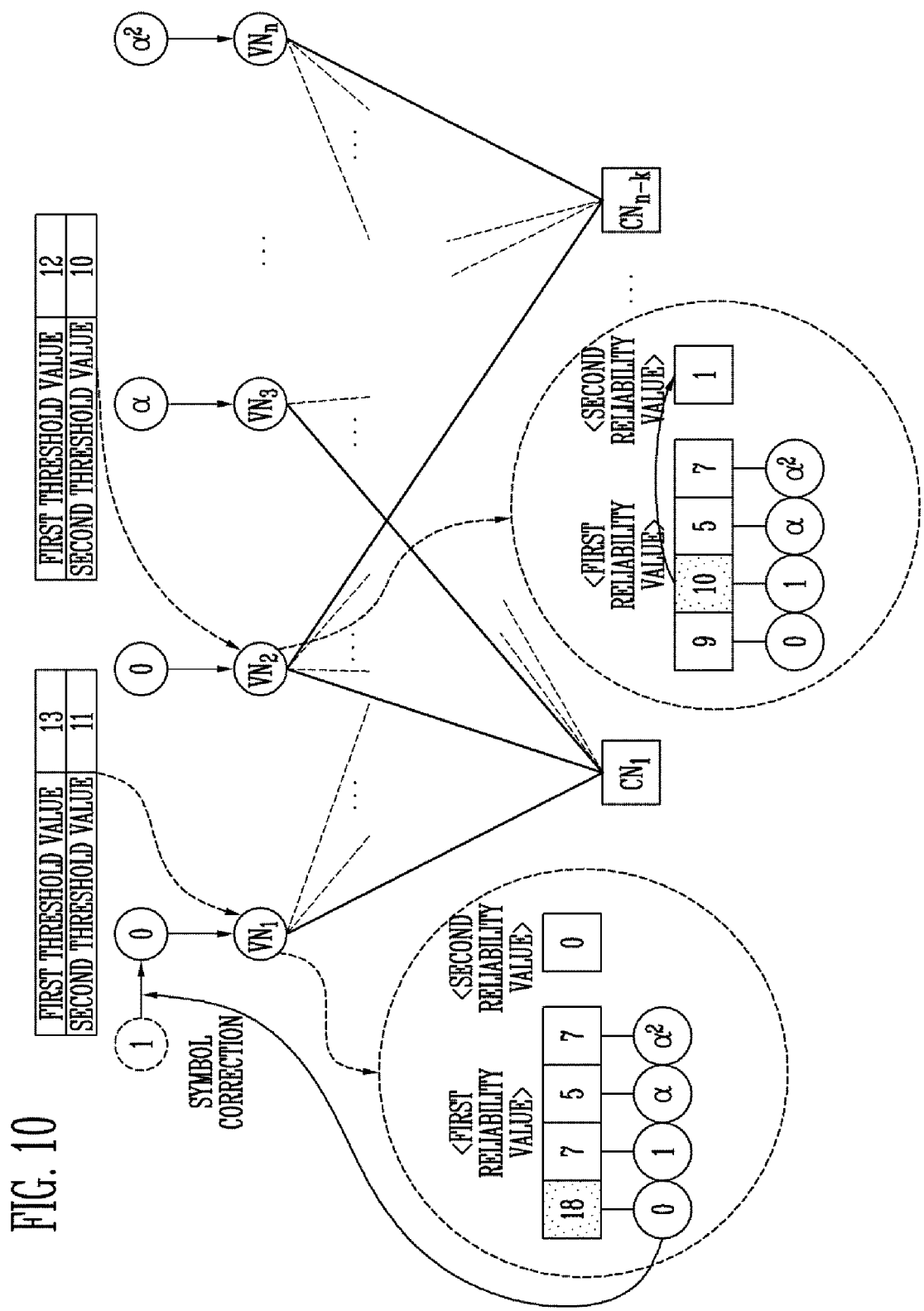
FIG. 10 is a diagram illustrating an example of a process for setting second reliability values based on an embodiment of the disclosed technology.

FIG. 10 is a diagram illustrating an example of a process for setting second reliability values based on an embodiment of the disclosed technology.

In the embodiment shown in FIG. 10, one bit is assigned to indicate a second reliability value.

A symbol correction unit 122b may update the first reliability values of candidate symbols corresponding to respective variable nodes $VN_1, VN_2, VN_3, \ldots, VN_n$ based on C2V messages that are input to the respective variable nodes $VN_1, VN_2, VN_3, \ldots, VN_n$ in each iteration.

In the example of FIG. 10, after first and second reliability values have been initialized, the variable node $VN_1$ receives seventeen C2V messages indicating the candidate symbol '0', receives four C2V messages indicating the candidate symbol '1', receives five C2V messages indicating the candidate symbol '$\alpha$', and receives six C2V messages indicating the candidate symbol '$\alpha^2$'. Therefore, the first reliability value of the candidate symbol '0' of the variable node $VN_1$ may be updated to 18 from the initial value of 1, the first reliability value of the candidate symbol '1' of the variable node $VN_1$ may be updated to 7 from the initial value of 3, the first reliability value of the candidate symbol '$\alpha$' of the variable node $VN_1$ may be updated to 5 from the initial value of 0, and the first reliability value of the candidate symbol '$\alpha^2$' in the variable node $VN_1$ may be updated to 7 from the initial value of 1.

Further, in the example of FIG. 10, the variable node $VN_2$ receives six C2V messages indicating the candidate symbol '0', receives nine C2V messages indicating the candidate symbol '1', receives four C2V messages indicating the candidate symbol '$\alpha$', and receives seven C2V messages indicating the candidate symbol '$\alpha^2$'. Therefore, the first reliability value of the candidate symbol '0' of the variable node $VN_2$ may be updated to 9 from the initial value of 3, the first reliability value of the candidate symbol '1' of the variable node $VN_2$ may be updated to 10 from the initial value of 1, the first reliability value of the candidate symbol '$\alpha$' of the variable node $VN_2$ may be updated to 5 from the initial value of 1, and the first reliability value of the candidate symbol '$\alpha^2$' of the variable node $VN_2$ may be updated to 7 from the initial value of 0.

After the first reliability values have been updated, the symbol correction unit 122b may check, for each of the variable nodes, whether a candidate symbol having a first reliability value equal to or greater than a first threshold value is present among the candidate symbols, and may adjust the value of the variable node which has a corresponding candidate symbol having the first reliability value equal to or greater than the first threshold value. In the example of FIG. 10, it is assumed that the first threshold value corresponding to the variable node $VN_1$ is set to 13 and that the first threshold value corresponding to the variable node $VN_2$ is set to 12.

In the case of the variable node $VN_1$, since the first reliability value of the candidate symbol '0', among the candidate symbols of the variable node $VN_1$, is equal to or greater than 13 which is the first threshold value corresponding to the variable node $VN_1$, the value of the variable node $VN_1$ may be adjusted from '1' to '0'.

In the case of the variable node $VN_2$, since there is no candidate symbol having a first reliability value equal to or greater than 12, which is the first threshold value corresponding to the variable node $VN_2$, among the candidate symbols of the variable node $VN_2$, the value of the variable node $VN_2$ may not be adjusted.

When there is no candidate symbol having a first reliability value equal to or greater than the first threshold value is present among the candidate symbols of the variable node, the symbol correction unit 122b may determine whether a candidate symbol having a first reliability value equal to or greater than a second threshold value is present among the candidate symbols of the variable node. When there is the candidate symbol having the first reliability value that is less than the first threshold value and is equal to or greater than the second threshold value, the symbol correction unit 122b may set a second reliability value in the corresponding variable node. In the example of FIG. 10, the second threshold value corresponding to the variable node $VN_2$ is set to 10.

In this case, since the first reliability value of the candidate symbol '1' among the candidate symbols of the variable node $VN_2$ is equal to or greater than 10, which is the second threshold value corresponding to the variable node $VN_2$, the second reliability value may be set in the variable node $VN_2$. Thus, in FIG. 10, the second reliability value of the variable node $VN_2$ is set to 1.

Figure 11:
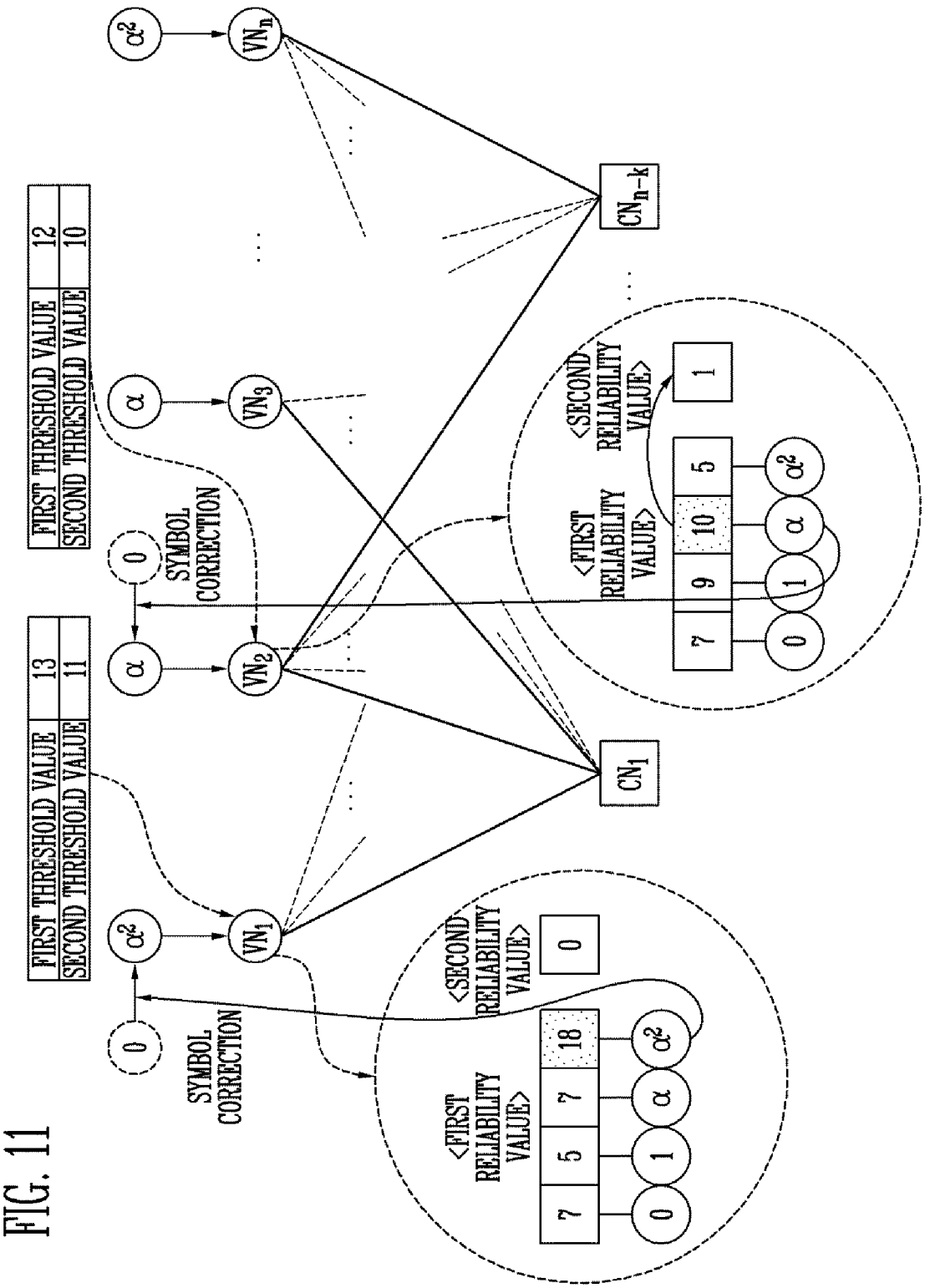
FIG. 11 is a diagram illustrating an example of a process for correcting a symbol depending on second reliability values based on an embodiment of the disclosed technology.

FIG. 11 is a diagram illustrating an example of a process for correcting a symbol depending on second reliability values based on an embodiment of the disclosed technology.

FIG. 11 illustrates an example of a case of a next iteration where first reliability values are initialized, and a second reliability value is maintained after the symbol modification and second reliability value setting have been done as described above with reference to FIG. 10. In the example of FIG. 11, the value of a variable node is adjusted based on the number of C2V messages received by the variable node in the next iteration.

Similar to the configuration described with reference to FIG. 10, a symbol correction unit 122b may update the first reliability values of candidate symbols based on the number of C2V messages received by a variable node. When there is a candidate symbol whose updated first reliability value is equal to or greater than a first threshold value, the symbol correction unit 122b may adjust the value of the corresponding variable node to the candidate symbol. In the example of FIG. 11, the first reliability value of the candidate symbol '$\alpha^2$' of a variable node $VN_1$ is equal to or greater than 13, which is the first threshold value corresponding to the variable node $VN_1$, and then the value of the variable node $VN_1$ is adjusted from '0' to '$\alpha^2$'.

Meanwhile, when there is no candidate symbol whose updated first reliability value is equal to or greater than the first threshold value, the symbol correction unit 122b may check whether there is a candidate symbol whose updated first reliability value is equal to or greater than the second threshold value. When there is the candidate symbol whose updated first reliability value is equal to or greater than the second threshold value, the symbol correction unit 122b may check whether a second reliability value is set in the corresponding variable node. When a second reliability value is not set in the corresponding variable node, the symbol correction unit 122b may set a second reliability value in the corresponding variable node, whereas when the second reliability value is set in the corresponding variable node, the symbol correction unit 122b may adjust the value of the corresponding variable node.

In the example of FIG. 11, the first reliability value of the candidate symbol '$\alpha$' of a variable node $VN_2$ is equal to or greater than 10, which is a second threshold value corresponding to the variable node $VN_2$. Since the second reliability value is already set in the variable node $VN_2$ in a previous iteration, the symbol correction unit may adjust the value of the variable node $VN_2$. In this case, the symbol correction unit may adjust the value of the variable node to a candidate symbol having a first reliability value equal to or greater than the second threshold value in a current iteration.

For example, as described above with reference to FIG. 10, even if the first reliability value of the candidate symbol '1', among the candidate symbols of the variable node $VN_2$, is equal to or greater than the second threshold value in a previous iteration, and then the second reliability value is set in the variable node $VN_2$, the value of the variable node $VN_2$ may be adjusted to '$\alpha$' when the first reliability value of the candidate symbol '$\alpha$', among the candidate symbols of the variable node $VN_2$, is equal to or greater than the second threshold value in the current iteration, as illustrated in FIG. 11.

Figure 12:
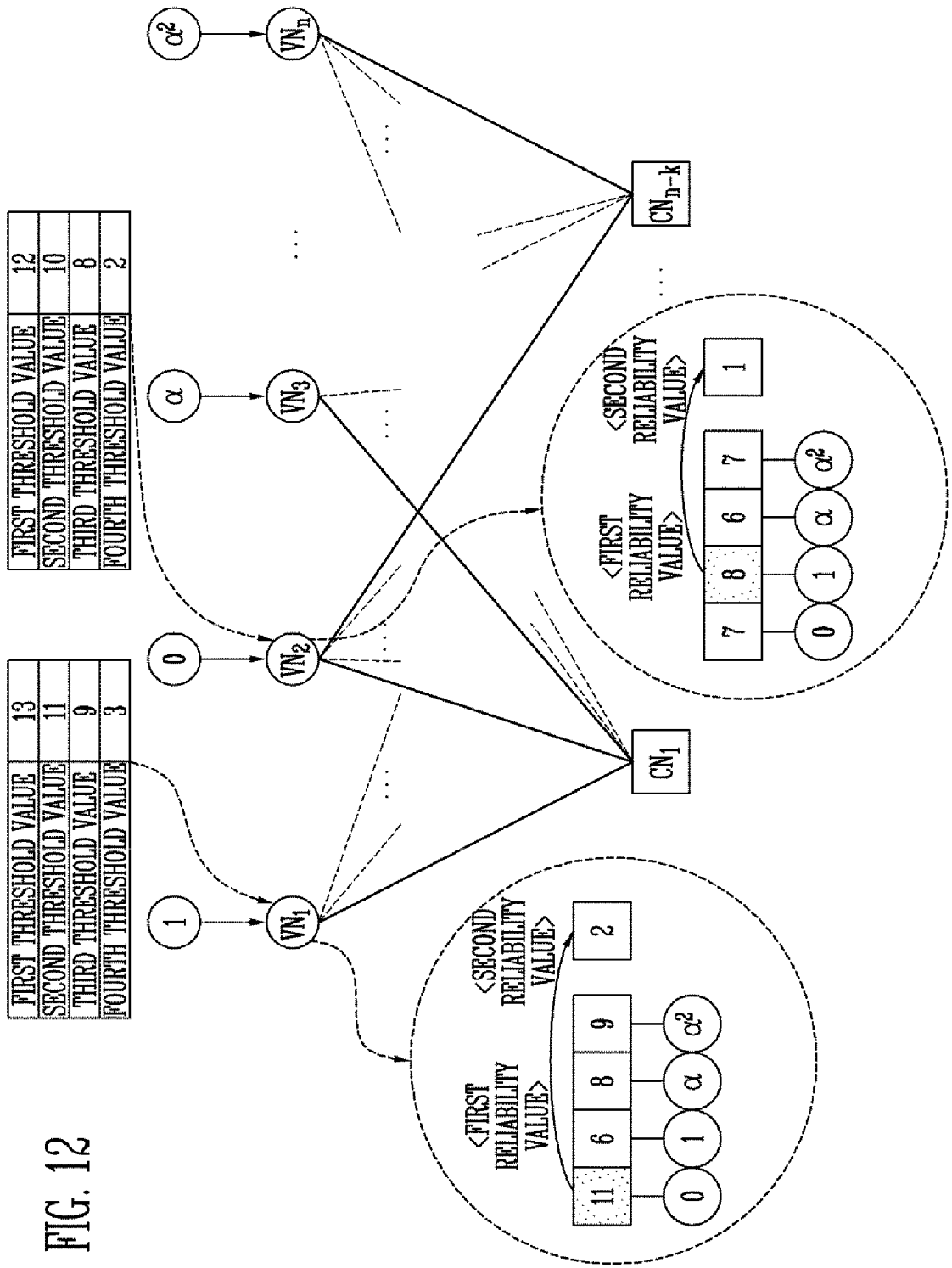
FIG. 12 is a diagram illustrating an example of a process for setting second reliability values based on an embodiment of the disclosed technology.

FIG. 12 is a diagram illustrating an example of a process for setting second reliability values according to an embodiment of the disclosed technology.

In the example of FIG. 12, two or more bits are assigned to indicate a second reliability value.

In the example of FIG. 12, after first and second reliability values have been initialized, the first reliability values are updated based on C2V messages received by the variable nodes $VN_1$ and $VN_2$.

In the example of FIG. 12, the first reliability value of the candidate symbol '0' of the variable node $VN_1$ is updated to 11, the first reliability value of the candidate symbol '1' of the variable node $VN_1$ is updated to 6, the first reliability value of the candidate symbol '$\alpha$' of the variable node $VN_1$ is updated to 8, and the first reliability value of the candidate symbol '$\alpha^2$' of the variable node $VN_1$ is updated to 9. Further, the first reliability value of the candidate symbol '0' of the variable node $VN_2$ is updated to 7, the first reliability value of the candidate symbol '1' of the variable node $VN_2$ is updated to 8, the first reliability value of the candidate symbol '$\alpha$' of the variable node $VN_2$ is updated to 6, and the first reliability value of the candidate symbol '$\alpha^2$' of the variable node $VN_2$ is updated to 7.

After the first reliability values have been updated, the symbol correction unit 122b may check, for each of the variable nodes, whether a candidate symbol having a first reliability value equal to or greater than a first threshold value is present among the candidate symbols, and may adjust the value of the variable node in which the candidate symbol having the first reliability value equal to or greater than the first threshold value is present. As an example, the first threshold value corresponding to the variable node $VN_1$ is set to 13 and the first threshold value corresponding to the variable node $VN_2$ is set to 12. Since a candidate symbol that satisfies the first threshold value is not present among the candidate symbols of the variable nodes $VN_1$ and $VN_2$, the values of the variable nodes $VN_1$ and $VN_2$ may not be adjusted.

For each of variable nodes whose corresponding candidate symbols do not have a first reliability value equal to or greater than the first threshold value, the symbol correction unit 122b may determine whether there is a candidate symbol having a first reliability value equal to or greater than the second threshold value. When there is a candidate symbol having a first reliability value that is less than the first threshold value and is equal to or greater than the second threshold value, the symbol correction unit 122b may update the second reliability value of the corresponding variable node. In the example of FIG. 12, the second threshold value corresponding to the variable node $VN_1$ is set to 11 and the second threshold value corresponding to the variable node $VN_2$ is set to 10. In this case, since the first reliability value of the candidate symbol '0', among the candidate symbols of the variable node $VN_1$, is equal to or greater than 11, which is the second threshold value corresponding to the variable node $VN_1$, the second reliability value of the variable node $VN_1$ may be updated. At this time, the second reliability value may be updated to a set value corresponding to the second threshold value. The set value may differ for each corresponding threshold value. For example, a set value corresponding to the second threshold value may be 2, and a set value corresponding to a third threshold value may be 1. In the example of FIG. 12, the set value corresponding to the second threshold value is 2, and then the second reliability value of the variable node $VN_1$ is updated to 2.

For each of variable nodes whose corresponding candidate symbols do not have the first reliability value equal to or greater than the second threshold value, the symbol correction unit 122b may determine whether there is a candidate symbol having a first reliability value equal to or greater than a third threshold value. When it is determined that there is a candidate symbol having a first reliability value that is less than the second threshold value and is equal to or greater than the third threshold value, the symbol correction unit 122b may update the second reliability value of the corresponding variable node. In the example of FIG. 12, the third threshold value corresponding to the variable node $VN_2$ is set to 8. In this case, since the first reliability value of the candidate symbol '1', among the candidate symbols of the variable node $VN_2$, is equal to or greater than 8, which is the third threshold value corresponding to the variable node $VN_2$, the second reliability value of the variable node $VN_2$ may be updated. In the example of FIG. 12, the set value corresponding to the third threshold value is 1, and then the second reliability value of the variable node $VN_2$ is updated to 1.

Figure 13:
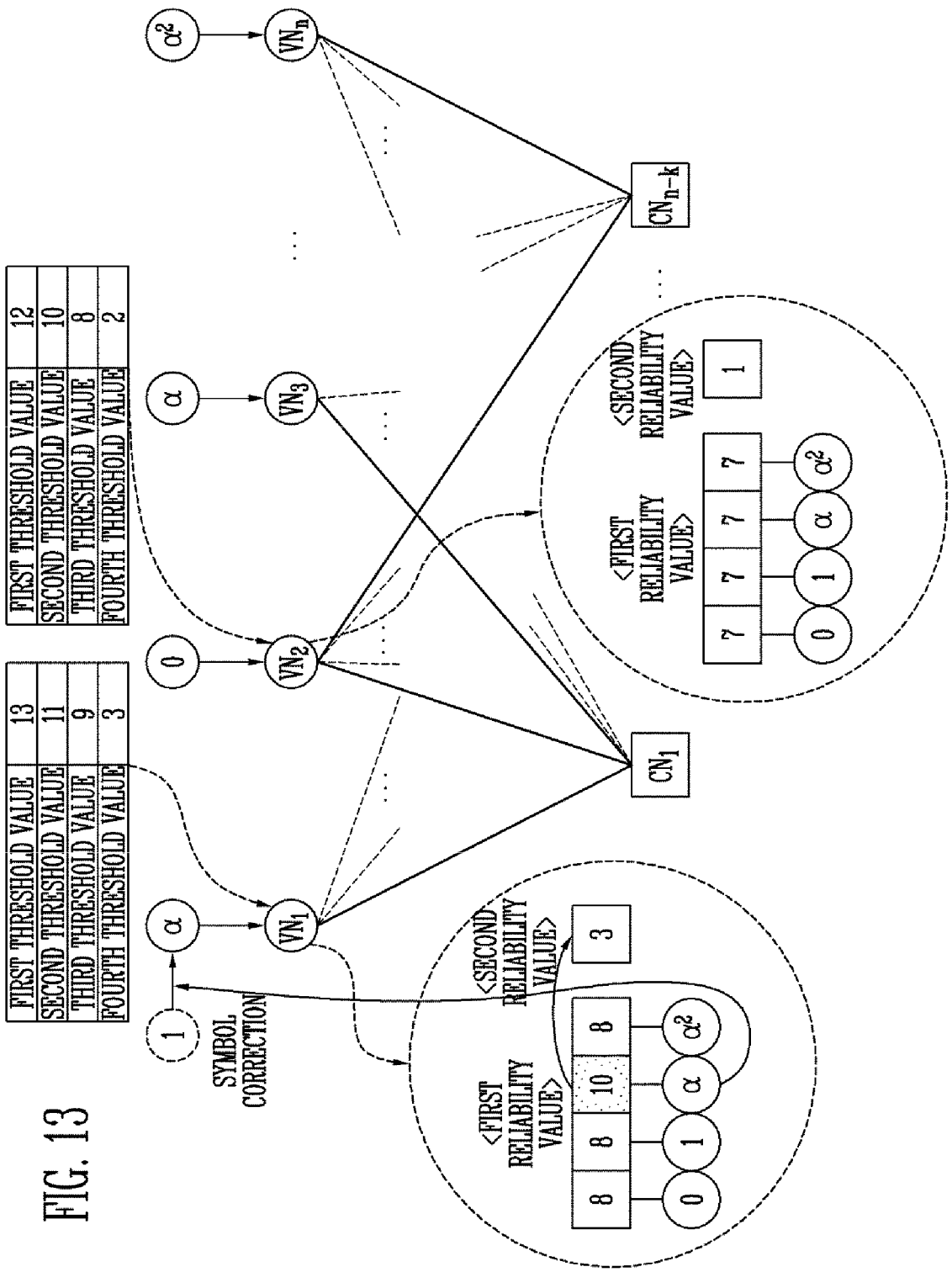
FIG. 13 is a diagram illustrating an example of a process for correcting a symbol depending on second reliability values based on an embodiment of the disclosed technology.

FIG. 13 is a diagram illustrating an example of a process for correcting a symbol depending on second reliability values according to an embodiment of the disclosed technology.

FIG. 13 illustrates an example of a next iteration where first reliability values are initialized, and the second reliability value is maintained after the update of the second reliability value has been performed as described above with reference to FIG. 12. In the example of FIG. 13, C2V messages are received in the next iteration and the symbol correction unit 122b may update the first reliability values of the candidate symbols based on the number of C2V messages received by a variable node.

After the first reliability values have been updated, the symbol correction unit 122b may check, for each of the variable nodes, whether a candidate symbol having a first reliability value equal to or greater than a first threshold value is present among the candidate symbols, and may adjust the value of the variable node when the candidate symbol having the first reliability value equal to or greater than the first threshold value is present. In the example of FIG. 13, it is assumed that the first threshold value corresponding to the variable node $VN_1$ is set to 13 and that the first threshold value corresponding to the variable node $VN_2$ is set to 12. In this case, since a candidate symbol that satisfies the first threshold value is not present among the candidate symbols of the variable nodes $VN_1$ and $VN_2$, the values of the variable nodes $VN_1$ and $VN_2$ may not be adjusted.

For each of variable nodes whose candidate symbols do not have a first reliability value equal to or greater than the first threshold value, the symbol correction unit 122b may determine whether there is a candidate symbol having a first reliability value equal to or greater than the second threshold value. When there is a candidate symbol having a first reliability value that is less than the first threshold value and is equal to or greater than the second threshold value, the symbol correction unit 122b may update the second reliability value of the corresponding variable node. In the example of FIG. 13, the second threshold value corresponding to the variable node $VN_1$ is set to 11 and the second threshold value corresponding to the variable node $VN_2$ is set to 10. In this case, since a candidate symbol that satisfies the second threshold value is not present among the candidate symbols of the variable nodes $VN_1$ and $VN_2$, the second reliability values of the variable nodes $VN_1$ and $VN_2$ may not be updated.

The symbol correction unit 122b may determine, for each of variable nodes whose candidate symbols do not have a first reliability value equal to or greater than the second threshold value, whether there is a candidate symbol having a first reliability value equal to or greater than a third threshold value. When it is determined that there is a candidate symbol having a first reliability value that is less than the second threshold value and is equal to or greater than the third threshold value, the symbol correction unit 122b may update the second reliability value of the corresponding variable node. In the example of FIG. 13, a third threshold value corresponding to the variable node $VN_1$ is set to 9 and a third threshold value corresponding to the variable node $VN_2$ is set to 8. In this case, since the first reliability value of the candidate symbol 'α', among the candidate symbols of the variable node $VN_1$, is equal to or greater than 9, which is the third threshold value corresponding to the variable node $VN_1$, the second reliability value of the variable node $VN_1$ may be updated. In the example of FIG. 13 the set value corresponding to the third threshold value is 1, and then the second reliability value of the variable node $VN_1$ is updated from 2 to 3.

When the second reliability value of the variable node is updated, the symbol correction unit 122b may determine whether the updated second reliability value is equal to or greater than a fourth threshold value. If the updated second reliability value is equal to or greater than the fourth threshold value, the symbol correction unit 122b may adjust the value of the variable node. The fourth threshold value corresponding to the variable node $VN_1$ is assumed to be set to 3. In this case, since the updated second reliability value of the variable node $VN_1$ is equal to or greater than 3, which is the fourth threshold value corresponding to the variable node $VN_1$, the value of the variable node $VN_1$ may be adjusted. The value of the variable node $VN_1$ may be adjusted to the candidate symbol, the candidate symbol 'α', whose first reliability value causes the update of the second reliability value in a current iteration.

Since a candidate symbol that satisfies the third threshold value is not present among the candidate symbols of the variable node $VN_2$, the second reliability value of the variable node $VN_2$ may not be updated.

Figure 14:
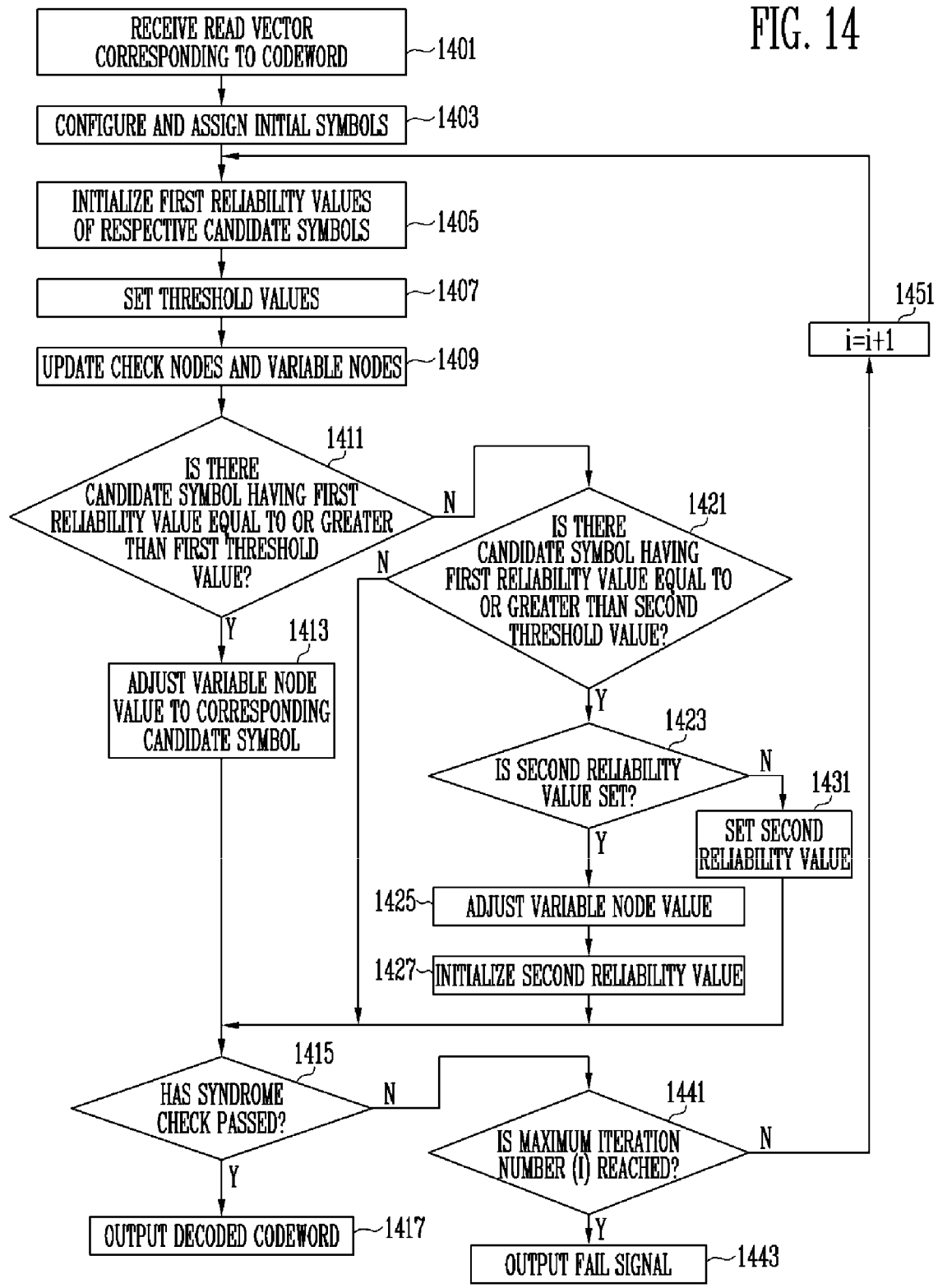
FIG. 14 is a flowchart illustrating a method of operating an error correction circuit based on an embodiment of the disclosed technology.

FIG. 14 is a flowchart illustrating a method of operating an error correction circuit based on an embodiment of the disclosed technology. In some implementations, the operations as shown in FIG. 14 can be performed by the error correction circuit 10 as shown in FIG. 1.

In some implementations, at least one of steps illustrated in FIG. 14 may be omitted, and the sequence of the steps may be changed.

At step 1401, the error correction circuit 10 may receive a read vector corresponding to a codeword.

At step 1403, the error correction circuit 10 may configure initial symbols based on the read vector and may assign the configured initial symbols to respective variable nodes in one to one correspondence.

At step 1405, the error correction circuit 10 may initialize the first reliability values of candidate symbols that can be selected as the values of respective variable nodes based on the initial symbols assigned to the respective variable nodes. In an embodiment, the error correction circuit 10 may differently initialize the first reliability values of respective candidate symbols depending on hamming distances between the initial symbols assigned to the respective variable nodes and the candidate symbols. For example, the error correction circuit 10 may initialize the first reliability values such that, as the hamming distances between the initial symbols and the candidate symbols are shorter, the first reliability values of the candidate symbols are initialized to higher values, whereas as the hamming distances between the initial symbols and the candidate symbols are longer, the first reliability values of the candidate symbols are initialized to lower values. In an embodiment, the error correction circuit 10 may differently initialize the first reliability values of respective candidate symbols by considering the round of an iteration. In some implementations, the round of the iteration can be considered in addition to the hamming distance to initialize the first reliability values of respective candidate symbols. In an embodiment, the error correction circuit 10 may initialize the first reliability value of a candidate symbol to a higher value than that in a previous iteration round as the iteration round increases and a hamming distance between the initial symbol and the corresponding candidate symbol is shorter. In an embodiment, the error correction circuit 10 may initialize the first reliability values of candidate symbols by considering the number of Unsatisfied Check Nodes (UCNs). In some implementations, the number of UCNs can be considered in addition to the hamming distance to initialize the first reliability values of respective candidate symbols. In an embodiment, the error correction circuit 10 may initialize the first reliability value of a candidate symbol to a higher value in an i+1-th iteration as the number of UCNs is larger in an i-th iteration and a hamming distance between the initial symbol and the candidate symbol is shorter.

At step 1407, the error correction circuit 10 may set threshold values that are used as criteria for determining whether to adjust the values of variable nodes. In an embodiment, the error correction circuit 10 may set initial threshold values to predefined values, the threshold values existing before a first iteration is performed. In an embodiment, the error correction circuit 10 may set the same n-th threshold value for all variable nodes. For example, the same first threshold value may be set for all variable nodes, and the same second threshold value may also be set for all variable nodes. In an embodiment, the error correction circuit 10 may set the initial threshold values to different values depending on the degrees of the variable nodes. For example, the error correction circuit 10 may set the initial threshold values to higher values for variable nodes having higher degrees and to lower values for variable nodes having lower degrees. In an embodiment, the error correction circuit 10 may change at least one of the threshold values depending on the round of an iteration. For example, the error correction circuit 10 may set at least one of the threshold values to a higher value as the iteration round increases. In an embodiment, the error correction circuit 10 may change at least one of the threshold values depending on the number of UCNs corresponding to a syndrome check. For example, the error correction circuit 10 may set at least one of the threshold values to a higher value in an i+1-th iteration as the number of UCNs corresponding to an i-th iteration is greater.

At step 1409, the error correction circuit 10 may perform check node update and variable node update. At step 1409, the exchange of C2V messages and V2C messages between the check nodes and the variable nodes may be performed.

At step 1411, the error correction circuit 10 may determine, for each of the variable nodes, whether there is a candidate symbol having a first reliability value equal to or greater than a first threshold value. When it is determined that there is the candidate symbol having the first reliability value equal to or greater than the first threshold value (in case of Y), step 1413 may be performed, otherwise (in case of N) step 1421 may be performed. When there is a candidate symbol having the first reliability value equal to or greater than the first threshold value, step 1413 is performed. When there is no candidate symbol having the first reliability value equal to or greater than the first threshold value, step 1421 is performed.

At step 1413, the error correction circuit 10 may adjust the value of the variable node corresponding to the candidate symbol having the first reliability value equal to or greater than the first threshold value.

At step 1415, the error correction circuit 10 may perform a syndrome check based on the values of variable nodes, and may determine whether the syndrome check has passed. When the syndrome check has passed (in case of Y), step 1417 may be performed, otherwise (in case of N) step 1441 may be performed.

At step 1417, the error correction circuit 10 may output the values of variable nodes, which have passed the syndrome check, as a decoded codeword.

At step 1421 which is performed when it is determined that a candidate symbol having the first reliability value equal to or greater than the first threshold value is not present among the candidate symbols of the variable node, the error correction circuit 10 may determine whether a candidate symbol having a first reliability value equal to or greater than a second threshold value is present among the candidate symbols of the corresponding variable node. When it is determined that a candidate symbol having the first reliability value equal to or greater than the second threshold value is present among the candidate symbols of the corresponding variable node (in case of Y), step 1423 may be performed, otherwise (in case of N) step 1415 may be performed.

At step 1423, the error correction circuit 10 may check whether a second reliability value is set in the variable node. When the second reliability value is set in the variable node (in case of Y), step 1425 may be performed, otherwise (in case of N) step 1431 may be performed.

At step 1425, the error correction circuit 10 may adjust the value of the variable node to the candidate symbol having the first reliability value equal to or greater than the second threshold value.

At step 1427, the error correction circuit 10 may initialize the second reliability value corresponding to the variable node whose value has been adjusted at step 1425. Thereafter, step 1415 may be performed.

At step 1431 which is performed when it is determined at step 1423 that a second reliability value is not set, the error correction circuit 10 may set a second reliability value in the corresponding variable node. Thereafter, step 1415 may be performed.

At step 1441 which is performed when it is determined at step 1415 that the syndrome check has not passed, the error correction circuit 10 may determine whether a number of iterations performed reaches to the maximum iteration number I. When a number of iterations performed reaches to the maximum iteration number I (in case of Y), step 1443 is performed to output a fail signal. When it is determined that a number of iterations performed does not reach to the maximum iteration number I (in case of N), an i+1-th iteration may be performed at step 1451.

Figure 15:
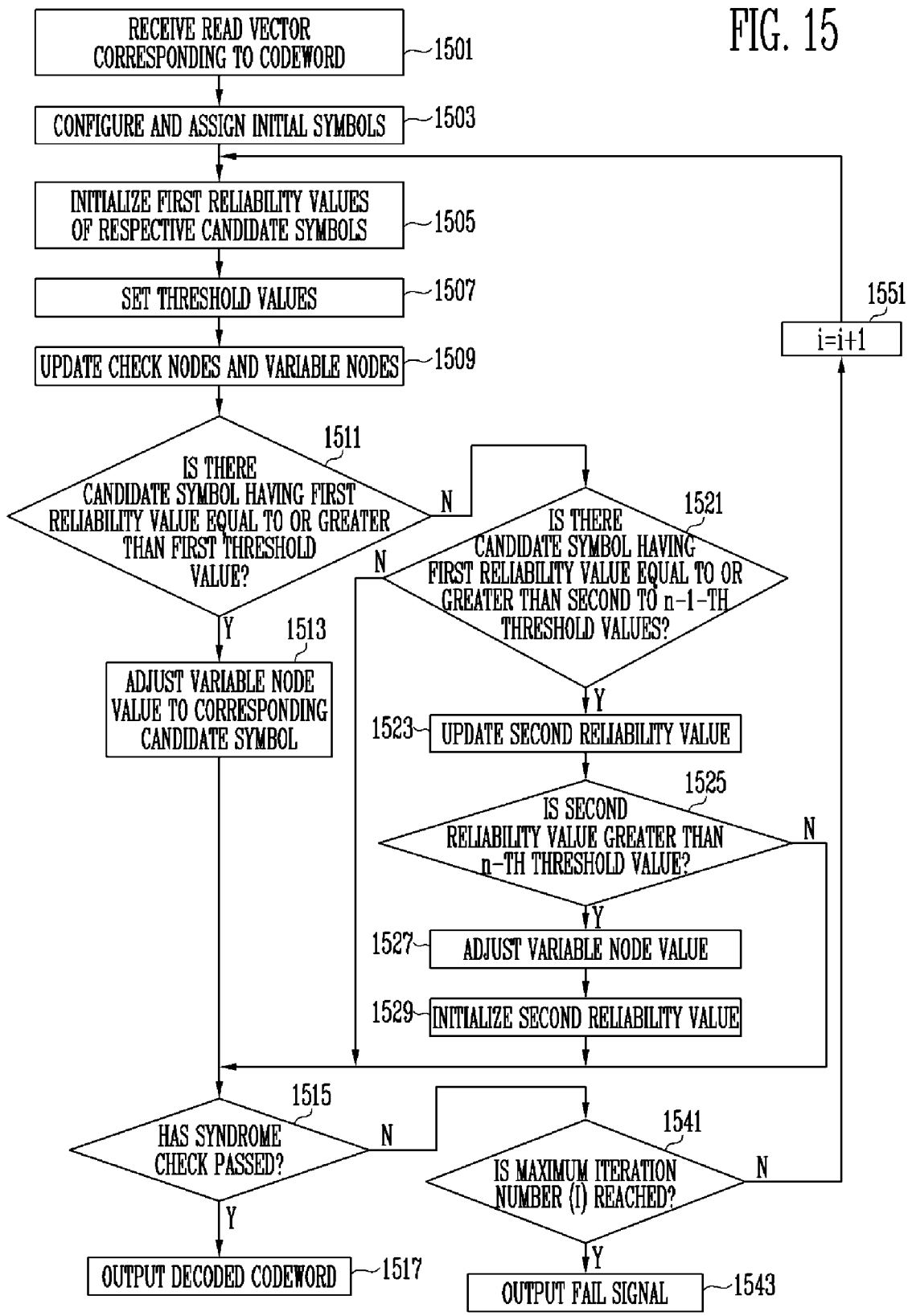
FIG. 15 is a flowchart illustrating a method of operating an error correction circuit based on an embodiment of the disclosed technology.

FIG. 15 is a flowchart illustrating a method of operating an error correction circuit based on an embodiment of the disclosed technology.

In the example of FIG. 15, the explanations for the operations that have been already explained with reference to FIG. 14 will be omitted. For example, steps 1501, 1503, 1505, 1507, 1509, 1511, 1513, 1515, 1517, 1541, 1543, and 1551 in FIG. 15 may be performed in the same way as steps 1401, 1403, 1405, 1407, 1409, 1411, 1413, 1415, 1417, 1441, 1443, and 1451 as illustrated in FIG. 14.

At step 1521 which is performed when it is determined at step 1511 that there is no candidate symbol among the candidate symbols of the variable node, which has the first reliability value equal to or greater than the first threshold value, the error correction circuit 10 may determine whether a candidate symbol having a first reliability value equal to or greater than second to n−1-th threshold values (where n is a natural number of 4 or more) is present among the candidate symbols of the corresponding variable node. Such a determination may be performed sequentially from higher threshold values, that is, in the sequence from the second threshold value to the n−1-th threshold value. Once it is determined that there is a candidate symbol among the candidate symbols, which has a first reliability value equal to or greater than any one of the second to n−1-th threshold values, the determination step can stop without the need to perform the determination for the remaining threshold values. For example, the determination of whether a candidate symbol having a first reliability value equal to or greater than the third to n−1-th threshold values is present among the candidate symbols may not be performed if the corresponding variable node has a candidate symbol having a first reliability value equal to or greater than the second threshold value. When it is determined that the candidate symbol having the first reliability value equal to or greater than the second to n−1-th threshold values is present among the candidate symbols of the corresponding variable node (in case of Y), step 1523 may be performed, otherwise (in case of N) step 1515 may be performed.

At step 1523, the error correction circuit 10 may update the second reliability value of the variable node. For example, the error correction circuit 10 may increase the second reliability value of the variable node by a set value corresponding to the highest threshold value satisfied by the first reliability value. For example, when there is a candidate symbol having a first reliability value equal to or greater than the second threshold value, the error correction circuit 10 may increase the second reliability value of the corresponding variable node by a first set value. Further, when there is a candidate symbol having a first reliability value equal to or greater than a third threshold value and less than the second threshold value, the error correction circuit may increase the second reliability value of the corresponding variable node by a second set value less than the first set value.

At step 1525, the error correction circuit 10 may determine whether the updated second reliability value is greater than an n-th threshold value. When the updated second reliability value is greater than the n-th threshold value (in case of Y), step 1527 may be performed, otherwise (in case of N) step 1515 may be performed.

At step 1527, the error correction circuit 10 may adjust the value of the variable node. For example, the error correction circuit 10 may adjust the value of the corresponding variable node to the candidate symbol whose first reliability value causes the update of the second reliability value in a current iteration.

At step 1529, the error correction circuit 10 may initialize the second reliability value of the variable node, the value of which has been adjusted based on the second reliability value. Thereafter, step 1515 may be performed.

Figure 16:
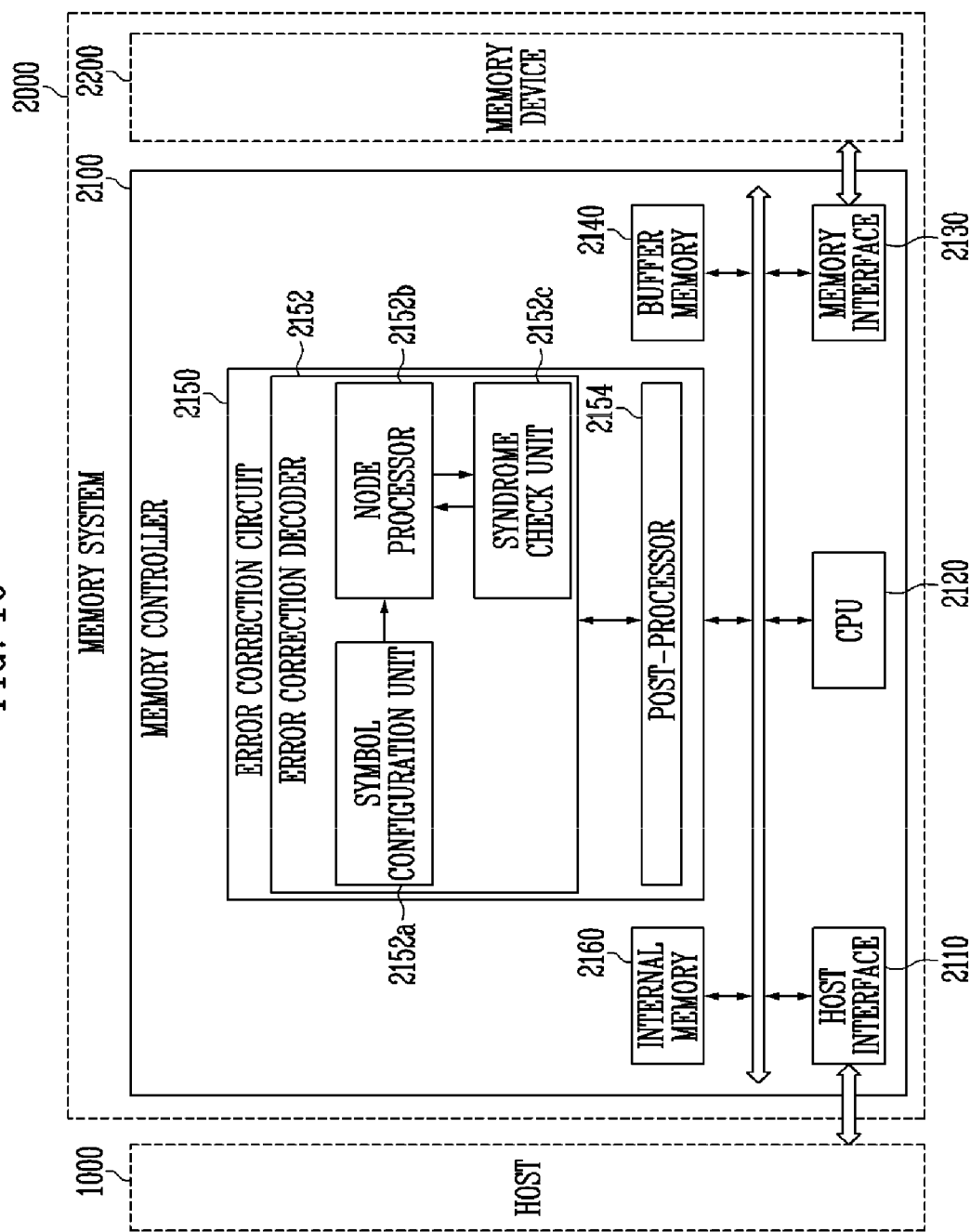
FIG. 16 is a diagram illustrating an example of a memory system based on embodiments of the disclosed technology.

FIG. 16 is a diagram illustrating a memory system to which embodiments of the disclosed technology are applied.

Referring to FIG. 16, a memory system 2000 may include a memory device 2200 which stores data, and a memory controller 2100 which controls the memory device 2200 under the control of a host 1000.

The host 1000 is capable of communicating with the memory system 2000 using an interface protocol, such as Peripheral Component Interconnect-Express (PCI-E), Advanced Technology Attachment (ATA), Serial ATA (SATA), Parallel ATA (PATA) or Serial Attached SCSI (SAS). Interface protocols used between the host 1000 and the memory system 2000 are not limited to the above-described examples, and an interface protocol, such as a Universal Serial Bus (USB), Multi-Media Card (MMC), Enhanced Small Disk Interface (ESDI), or Integrated Drive Electronics (IDE) interface protocol, may be used.

The memory controller 2100 may control the overall operation of the memory system 2000, and may control data exchange between the host 1000 and the memory device 2200.

The memory controller 2100 may include a host interface 2110, a Central Processing Unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may perform data exchange with the host 1000 using a communication protocol.

The CPU 2120 may perform various types of calculations or generate commands and addresses so as to control the memory device 2200. For example, the CPU 2120 may generate various commands required for a program operation, a read operation, an erase operation, a data compression operation, and copy-back operations.

The memory interface 2130 may communicate with the memory device 2200 using a communication protocol.

The buffer memory 2140 may temporarily store data while the memory controller 2100 controls the memory device 2200. For example, until the program operation is completed, data received from the host may be temporarily stored in the buffer memory 2140. Further, during the read operation, data read from the memory device 2200 may also be temporarily stored in the buffer memory 2140.

The error correction circuit 2150 may perform encoding and decoding for error correction during the program operation or the read operation. The error correction circuit 2150 may be an error correction circuit using a Non-Binary LDPC (NB-LDPC) code.

The error correction circuit 2150 may include an error correction decoder 2152 and a post-processor 2154.

The error correction decoder 2152 may perform error correction decoding on read data received from the memory device 2200. The error correction decoder 2152 may correct an error using a parity check matrix when an error is detected in an iterative decoding procedure for error correction. For example, the error correction decoder 2152 may calculate a syndrome corresponding to the read data based on the parity check matrix, and may determine, based on the calculated syndrome, whether an error is contained in the read data. The error correction decoder 2152 may correct the error and output error-corrected data when the error contained in the read data is correctable. The error correction decoder 2152 may report a failure in decoding to the CPU 2120 when the error contained in the read data is not correctable.

The error correction decoder 2152 may include a symbol configuration unit 2152a, a node processor 2152b, and a syndrome check unit 2152c. The error correction decoder 2152 may perform the same or similar operation as the error correction decoder 100, described above with reference to FIG. 1. For example, the symbol configuration unit 2152a, the node processor 2152b, and the syndrome check unit 2152c, which are illustrated in FIG. 16, may perform operations respectively corresponding to the symbol configuration unit 110, the node processor 120, and the syndrome check unit 130, which are illustrated in FIG. 1.

The post-processor 2154 may perform an operation corresponding to the post-processor 200 illustrated in FIG. 1.

The internal memory 2160 may be used as a storage unit which stores various types of information required for the operation of the memory controller 2100. The internal memory 2160 may store a plurality of tables. For example, the internal memory 2160 may store a mapping table for mapping between logical addresses and physical addresses.

The memory device 2200 may perform a program operation, a read operation, an erase operation, a data compression operation, and copy-back operations under the control of the memory controller 2100. The memory device 2200 may be implemented as a volatile memory device in which stored data is lost when the supply of power is interrupted or as a nonvolatile memory device in which stored data is retained even when the supply of power is interrupted.

Figure 17:
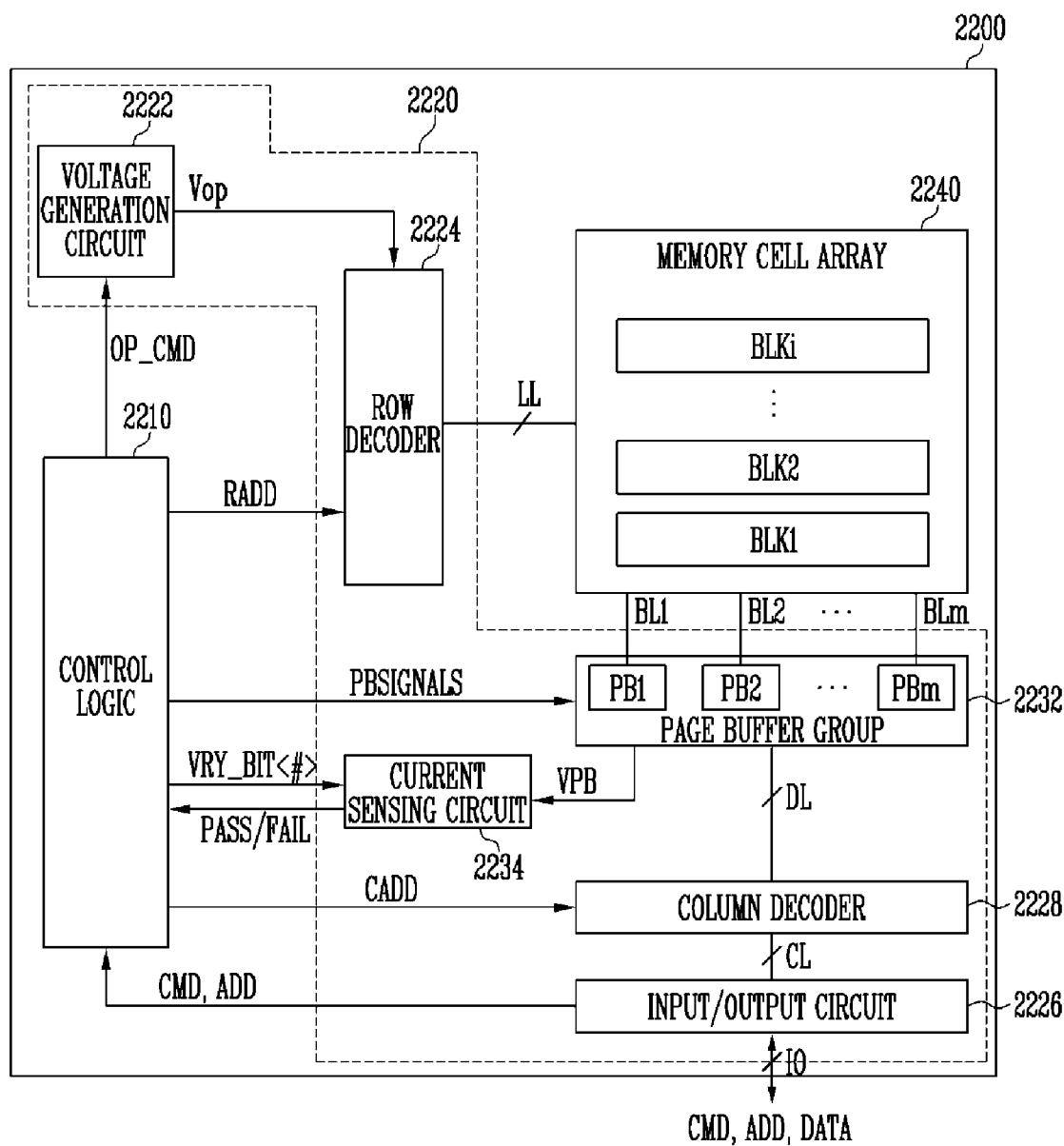
FIG. 17 is a diagram illustrating an example of a memory device based on an embodiment of the disclosed technology.

FIG. 17 is a diagram illustrating a memory device based on an embodiment of the disclosed technology. The memory device illustrated in FIG. 17 may be applied to the memory system of FIG. 16.

The memory device 2200 may include a control logic 2210, peripheral circuits 2220 and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 of FIG. 16.

The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PB SIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generation circuit 2222 may generate various operating voltages Vop that are used for the program, read, and erase operations in response to the operation signal OP_CMD received from the control logic 2210. For example, the voltage generation circuit 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, which are received from the memory controller through input/output (TO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to each bit line. The page buffers PB1 to PBm may be operated in response to the page buffer control signals PBSIGNALS received from the control logic 2210. For example, during a program operation, the page buffers PB1 to PBm may temporarily store program data received from the memory controller, and may control voltages to be applied to the bit lines BL1 to BLm based on the program data. Also, during a read operation, the page buffers PB1 to PBm may temporarily store data received through the bit lines BL1 to BLm or may sense voltages or currents of the bit lines BL1 to BLm.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a pass signal PASS or a fail signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 18:
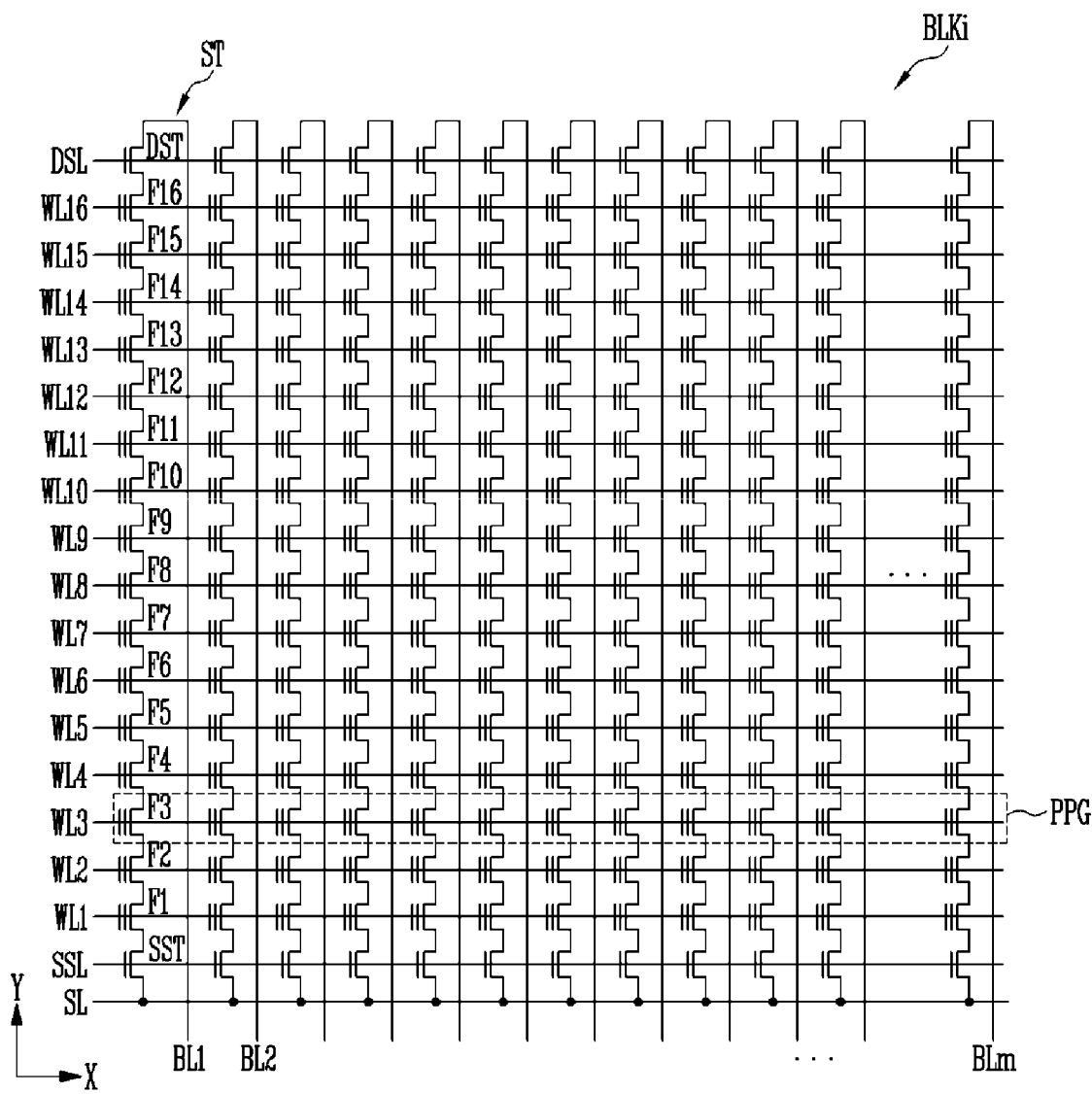
FIG. 18 is a diagram illustrating an example of a memory block based on an embodiment of the disclosed technology.

FIG. 18 is a diagram illustrating an example of a memory block.

A memory cell array may include a plurality of memory blocks, and any one memory block BLKi of the plurality of memory blocks is illustrated in FIG. 18 for convenience of description.

A plurality of word lines arranged in parallel to each other between a first select line and a second select line may be coupled to the memory block BLKi. The first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST, which are coupled in series to each other between the source line SL and the first bit line BL1. A single string ST may include at least one source select transistor SST and at least one drain select transistor DST. In some implementations, more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKi may include a number of physical pages PPG identical to the number of word lines WL1 to WL16.

One memory cell may store one bit of data. This cell is called a single-level cell (SLC). Here, one physical page PPG may store data corresponding to one logical page LPG The data corresponding to one logical page LPG may include a number of data bits identical to the number of cells included in one physical page PPG For example, when two or more bits of data are stored in one memory cell, one physical page PPG may store data corresponding to two or more logical pages LPG For example, in a memory device driven in an MLC type, data corresponding to two logical pages may be stored in one physical page PPG In a memory device driven in a TLC type, data corresponding to three logical pages may be stored in one physical page PPG FIG. 19 is a diagram illustrating an embodiment of a memory system including the memory controller of FIG. 16.

Figure 19:
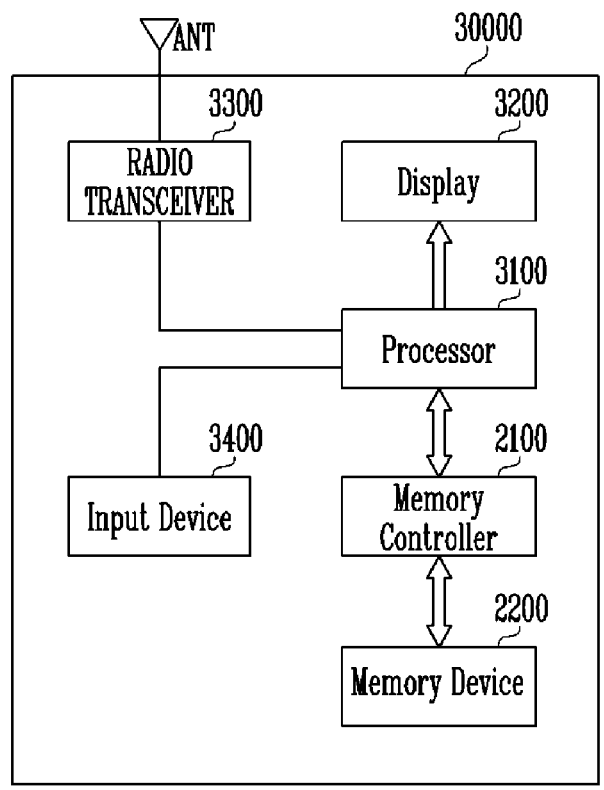
FIGS. 19 and 20 are diagrams illustrating embodiments of a memory system including a memory controller as shown in FIG. 16.

Referring to FIG. 19, a memory system 30000 may be implemented as a cellular phone, a smartphone, a tablet, a personal computer (PC), a personal digital assistant (PDA) or a wireless communication device. The memory system 30000 may include a memory device 2200 and a memory controller 2100 that is capable of controlling the operation of the memory device 2200.

The memory controller 2100 may control a data access operation, e.g., a program, erase, or read operation, of the memory device 2200 under the control of a processor 3100.

Data programmed in the memory device 2200 may be output through a display 3200 under the control of the memory controller 2100.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 20:
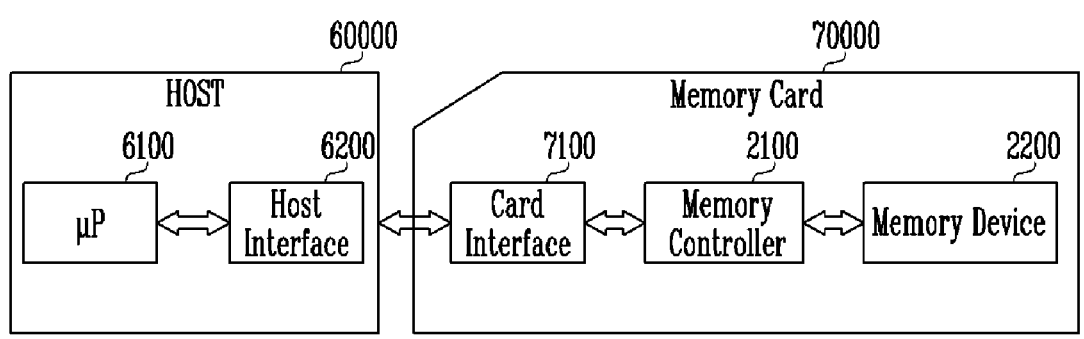

FIG. 20 is a diagram illustrating an embodiment of a memory system including the memory controller of FIG. 16.

Referring to FIG. 20, a memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor (μP) 6100.

In accordance with the disclosed technology, the performance of an error correction circuit using a NB-LDPC code may be improved.

While the exemplary embodiments of the disclosed technology have been disclosed for illustrative purposes, those skilled in the art will appreciate that various modifications, additions and substitutions are possible. Therefore, the scope of the disclosed technology must be defined by the appended claims and equivalents of the claims rather than by the description preceding them.

What is claimed is:

1. An error correction circuit for performing error correction decoding based on an iterative decoding scheme using a Non-Binary Low Density Parity Check (NB-LDPC) code, comprising:
   a symbol configuration circuit configured to configure an initial symbol to be assigned as a variable node value to a variable node;
   a reliability value initialization circuit configured to initialize first reliability values of candidate symbols corresponding to the variable node based on the initial symbol assigned to the variable node; and
   a symbol correction circuit configured to update the first reliability values of the candidate symbols based on communications received from a check node coupled to the variable node, the candidate symbols having updated first reliability values, respectively, and configured to adjust the variable node value to one of the candidate symbols based on a comparison with the updated first reliability value of one of the candidate symbols with a first threshold value.

2. The error correction circuit according to claim 1, wherein the reliability value initialization circuit initializes the first reliability values of each of the candidate symbols based on a hamming distance between the initial symbol assigned to the variable node and a corresponding candidate symbol.

3. The error correction circuit according to claim 1, wherein the reliability value initialization circuit initializes a first reliability value of a certain candidate symbol to a higher value as a hamming distance between the initial symbol and the certain candidate symbol is shorter.

4. The error correction circuit according to claim 1, wherein the reliability value initialization circuit initializes the first reliability values of each of the candidate symbols based on a number of the iteration.

5. The error correction circuit according to claim 4, wherein the reliability value initialization unit initializes the first reliability value of a certain candidate symbol to a higher value as the number of the iteration is increased.

6. The error correction circuit according to claim 1, further comprising:
a syndrome check circuit configured to perform a syndrome check using the adjusted variable node value.

7. The error correction circuit according to claim 6, wherein the reliability value initialization circuit is configured to initializes the first reliability value for an i+1-th iteration based a number of Unsatisfied Check Nodes (UCNs) from an i-th iteration.

8. The error correction circuit according to claim 7, wherein the reliability value initialization circuit is configured to initialize a first reliability value of a certain candidate symbol to a higher value as the number of UCNs is greater.

9. The error correction circuit according to claim 6, further comprising:
a threshold value setting circuit configured to change the first threshold value based on a number of UCNs.

10. The error correction circuit according to claim 9, wherein the threshold value setting circuit is configured to change the first threshold value to a higher value as the number of UCNs is greater.

11. The error correction circuit according to claim 1, further comprising:
a threshold value setting circuit configured to change the first threshold value based on a number of the iteration.

12. The error correction circuit according to claim 11, wherein the threshold value setting circuit changes the first threshold value to a higher value as the number of the iteration is increased.

13. The error correction circuit according to claim 11, wherein the symbol correction circuit is configured to:
determine whether there is a candidate symbol, among the candidate symbols, which has an updated first reliability value which is equal to or greater than a second threshold value less than the first threshold value when there is no candidate symbol, the updated first reliability value of which is equal to or greater than the first threshold value,
increase a second reliability value corresponding to the variable node by a first set value based on the determination,
determine whether there is a candidate symbol, among the candidate symbols, which has an updated first reliability value which is equal to or greater than a third threshold value less than the second threshold value when there is no candidate symbol, the updated first reliability value of which is equal to or greater than the second threshold value,
increase the second reliability value corresponding to the variable node by a second set value based on the determination, and
adjust the variable node value when the increased second reliability value is equal to or greater than a fourth threshold value.

14. The error correction circuit according to claim 13, wherein the symbol correction circuit is configured to, adjust the variable node value to a candidate symbol having a first reliability value that is less than the first threshold value and is equal to or greater than the second threshold value.

15. The error correction circuit according to claim 13, wherein the symbol correction circuit is configured to, adjust the variable node value to a candidate symbol having a first reliability value that is less than the second threshold value and is equal to or greater than the third threshold value.

16. The error correction circuit according to claim 13, wherein the second set value is less than the first set value.

17. The error correction circuit according to claim 1, wherein the threshold value setting circuit sets the first threshold value based on a degree of the variable node.

18. The error correction circuit according to claim 17, wherein the threshold value setting circuit sets the first threshold value to a higher value as the degree of the variable node is higher.

19. The error correction circuit according to claim 1, wherein the symbol correction unit is configured to:
determine whether there is a candidate symbol, among the candidate symbols, which has an updated first reliability value that is equal to or greater than a second threshold value less than the first threshold value when there is no candidate symbol, the updated first reliability value of which is equal to or greater than the first threshold value,
set a second reliability value in the variable node based on the determination, and
adjust the variable node value when a candidate symbol, among the candidate symbols, which has an updated first reliability value that is equal to or greater than the second threshold value and is less than the first threshold value in a next iteration.

20. The error correction circuit according to claim 19, wherein the symbol correction circuit adjusts the variable node value to the candidate symbol having the first reliability value that is equal to or greater than the second threshold value and is less than the first threshold value in the next iteration.

* * * * *